(12) United States Patent
Song et al.

(10) Patent No.: US 11,347,271 B2
(45) Date of Patent: May 31, 2022

(54) MOBILE TERMINAL

(71) Applicant: LG ELECTRONICS INC., Seoul (KR)

(72) Inventors: Insu Song, Seoul (KR); Insun Lee, Seoul (KR); Changsue Park, Seoul (KR); Minsoo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/143,918

(22) Filed: Jan. 7, 2021

(65) Prior Publication Data
US 2022/0075418 A1 Mar. 10, 2022

(30) Foreign Application Priority Data

Sep. 9, 2020 (WO) ................ PCT/KR2020/012135

(51) Int. Cl.
*G06F 1/16* (2006.01)
*H05K 5/02* (2006.01)
(52) U.S. Cl.
CPC .......... *G06F 1/1652* (2013.01); *G06F 1/1656* (2013.01); *G06F 1/1681* (2013.01); *H05K 5/0226* (2013.01)
(58) Field of Classification Search
CPC ..... G06F 1/1652; G06F 1/1656; G06F 1/1681
See application file for complete search history.

(56) References Cited

U.S. PATENT DOCUMENTS

| 10,174,534 B2* | 1/2019 | Tazbaz ...................... E05D 3/14 |
| 2010/0041448 A1* | 2/2010 | Gaddy ................. G06F 1/1616 455/575.3 |
| 2010/0177020 A1 | 7/2010 | Bemelmans et al. |
| 2012/0314400 A1 | 12/2012 | Bohn |
| 2016/0216737 A1 | 7/2016 | Hayk |
| 2020/0124229 A1* | 4/2020 | Han ........................ G06F 1/166 |

FOREIGN PATENT DOCUMENTS

| KR | 1020100094148 | 8/2010 |
| KR | 1020170081559 | 7/2017 |
| KR | 1020180130076 | 12/2018 |
| KR | 1020190077107 | 7/2019 |

OTHER PUBLICATIONS

PCT International Application No. PCT/KR2020/012135, International Search Report dated Jun. 7, 2021, 10 pages.
European Patent Office Application Serial No. 21192421.2, Search Report dated Feb. 15, 2022, 7 pages.

* cited by examiner

*Primary Examiner* — Anthony Q Edwards
(74) *Attorney, Agent, or Firm* — Lee Hong Degerman Kang & Waimey

(57) ABSTRACT

The present disclosure provides a mobile terminal including: a body including a first frame and a second frame configured to slide to transition to either a first or second state; a flexible display configured to cover a part of the body, wherein a front surface area of the flexible display is configured to vary according to the sliding of the second frame; and a link supporter disposed between the first and second frames, wherein the link supporter comprises: a first link, wherein a first end of the first link is hinge-coupled to the first frame; a second link, wherein a first end of the second link is hinge-coupled to the first link and a second end of the second link is coupled to the second frame; and a hinge cam configured to be inserted a second end of the first link and the first end of the second link.

10 Claims, 19 Drawing Sheets

(a)

(b)

(a)

(b)

(a)

(b)

(a)

(b)

(a)

(b)

(a)

(b)

(a)

(b)

(a)

(b)

(a)

(b)

MOBILE TERMINAL

CROSS-REFERENCE TO RELATED APPLICATION(S)

Pursuant to 35 U.S.C. § 119 (a), this application claims the benefit of an earlier filing date and right of priority to International Application No. PCT/KR2020/012135 filed on Sep. 9, 2020, the contents of which are hereby incorporated by reference herein in its entirety.

BACKGROUND

Field

The present disclosure relates to a mobile terminal, and more particularly, to a mobile terminal that has a flexible display and is capable of extending a size of a screen while the display is scrolled and slid at the same time.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

In recent years, because of a development of a broadcasting technology and a network technology, functions of the display device have also been considerably diversified, and a performance of the device has been improved accordingly. That is, the display device has been developed to provide not only broadcast contents but also various other contents to the user. For example, the display device may provide game play, music listening, internet shopping, user customized information, and the like using various applications as well as programs received from the broadcasting station. In order to perform such extended functions, the display device may be basically connected to other devices or networks using various communication protocols, and may provide the user with a ubiquitous computing environment. In other words, the display device has evolved into a smart device that enables connectivity to a network and continuous computing.

Recently, a flexible display having sufficient elasticity and capable of large deformation has been developed. The size of a mobile terminal can be varied using the deformable nature of the flexible display. For the mobile terminal having such a variable structure, changing the size of the mobile terminal should be stably performed, and there is a need for a structure to support the extended display unit to maintain a flat state of the display unit.

SUMMARY

Accordingly, the present disclosure is directed to a mobile terminal that substantially obviates one or more problems due to limitations and disadvantages of the related art.

An object of the present disclosure is to provide a mobile terminal for changing the size of a display and maintaining the flatness thereof.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a mobile terminal may include: a body including a first frame and a second frame configured to slide with respect to the first frame in a first direction to transition the body from a first state to a second state or in a second direction opposite to the first direction, wherein the body is configured to transition to either a first state or a second state; a flexible display configured to cover a part of the body, wherein a front surface of the flexible display varies according to the sliding of the second frame; and a link supporter disposed between the first and second frames, wherein the link supporter includes: a first link, wherein a first end of the first link is hinge-coupled to the first frame; a second link, wherein a first end of the second link is hinge-coupled to the first link and a second end of the second link is coupled to the second frame; and a hinge cam configured to penetrate a second end of the first link and the first end of the second link, wherein a location of the hinge cam is configured to vary depending on an angle between the first and second links, wherein the link supporter is configured to fold the first link and the second link together in the first state and spread the first link and the second link apart in the second state.

The hinge cam may be configured to extend with respect to a space between a rear surface of the flexible display and the second frame in the second state.

The hinge cam may be configured to be inserted into the first and second links in the first state, and the hinge cam may be configured to protrude from the first and second links in the second state.

The mobile terminal may include: a hinge hole formed in the second end of the first link and the first end of the second link; and a cam protrusion formed inside the hinge hole; and a spiral groove formed outside the hinge cam, wherein the cam protrusion is configured to be inserted into the spiral groove.

The hinge cam may include a head in contact with the second frame in the second state.

The link supporter may be located in a third direction perpendicular to the first direction in the first state, and the angle between the first and second links may not exceed 180 degrees in the second state.

The mobile terminal may include an elastic member disposed between the second end of the first link and the first end of the second link.

The mobile terminal may include: a side portion disposed on an end of the second frame facing in the first direction; and a link storage space formed inside the side portion, wherein the link supporter is located within the link storage space in the first state.

A plurality of link supporters may be arranged in a third direction perpendicular to the first direction.

It is to be understood that both the foregoing general description and the following detailed description of the present disclosure are exemplary and explanatory and are intended to provide further explanation of the disclosure as claimed.

As is apparent from the above description, the present disclosure has effects as follows.

As described above, the mobile terminal according to the present disclosure may adjust the size of a screen according to the need, thereby satisfying both portability and utility.

The mobile terminal may prevent the display from being damaged since stress is not concentrated at a specific point of the display.

The mobile terminal may prevent the screen from being wavy, that is, keep the flatness of the screen independently of the state transition of the mobile terminal.

The thickness of the link supporter changes according to the state transition of the mobile terminal, thereby minimizing the effect of the state transition on the sliding movement and stably supporting the extended screen of the display in the second state.

The link supporter may support the sliding movement of the mobile terminal, thereby reducing the degree of tilting.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein.

DETAILED DESCRIPTION OF THE DISCLOSURE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
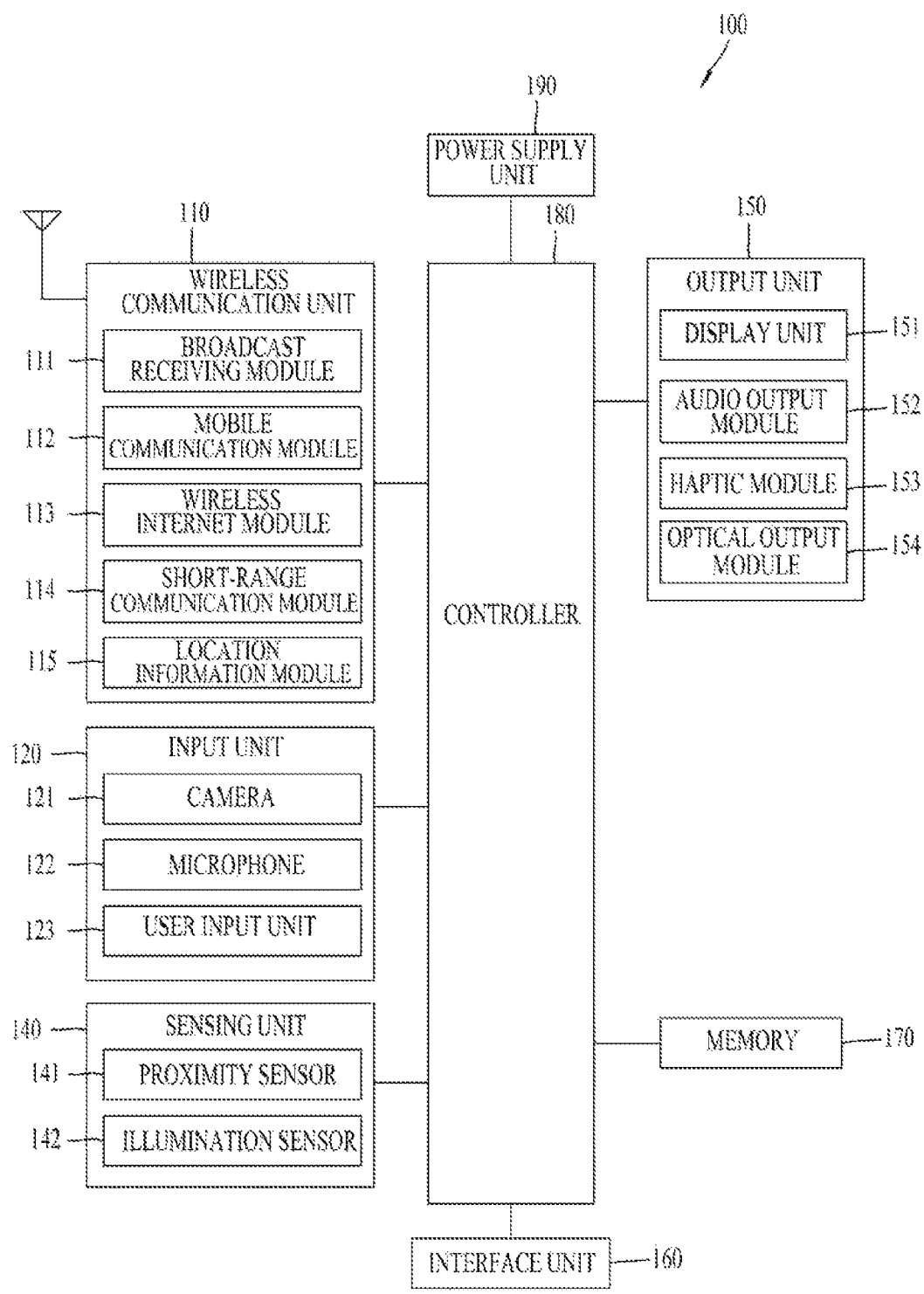
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above with reference to FIG. 1. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Figure 2:
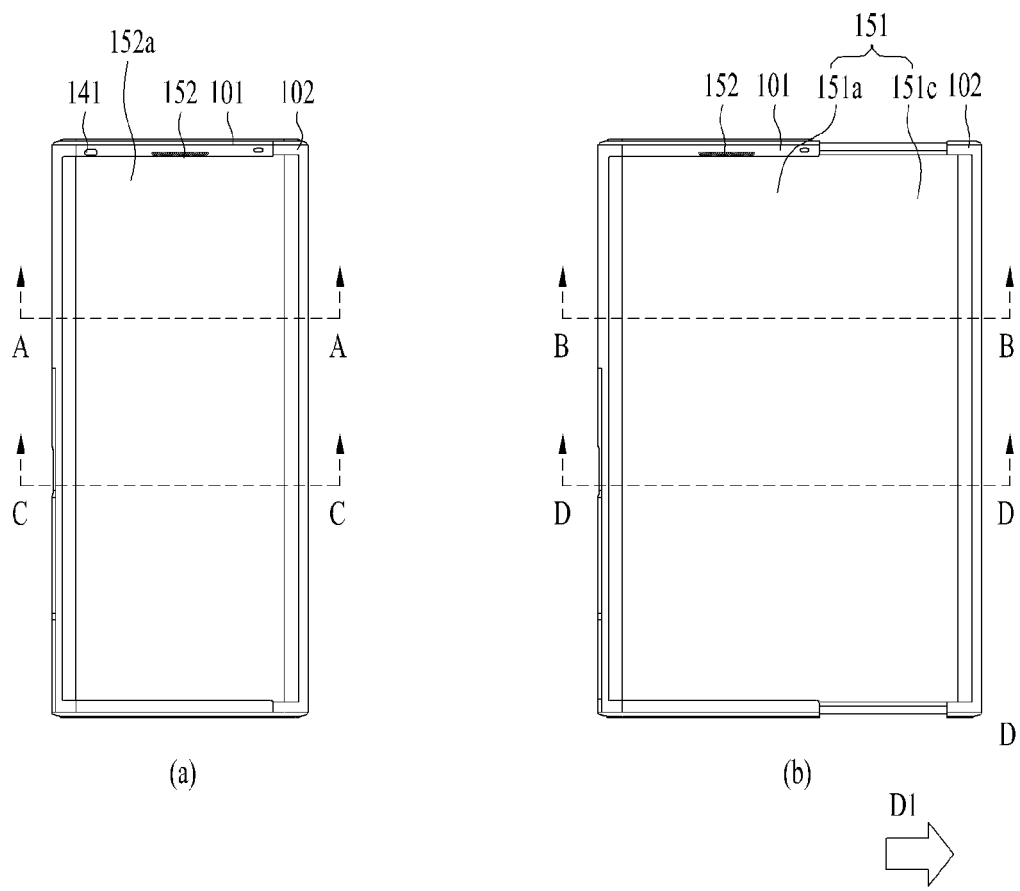
FIG. 2 is a front view of a first state and a second state of the mobile terminal in accordance with an embodiment.
Figure 3:
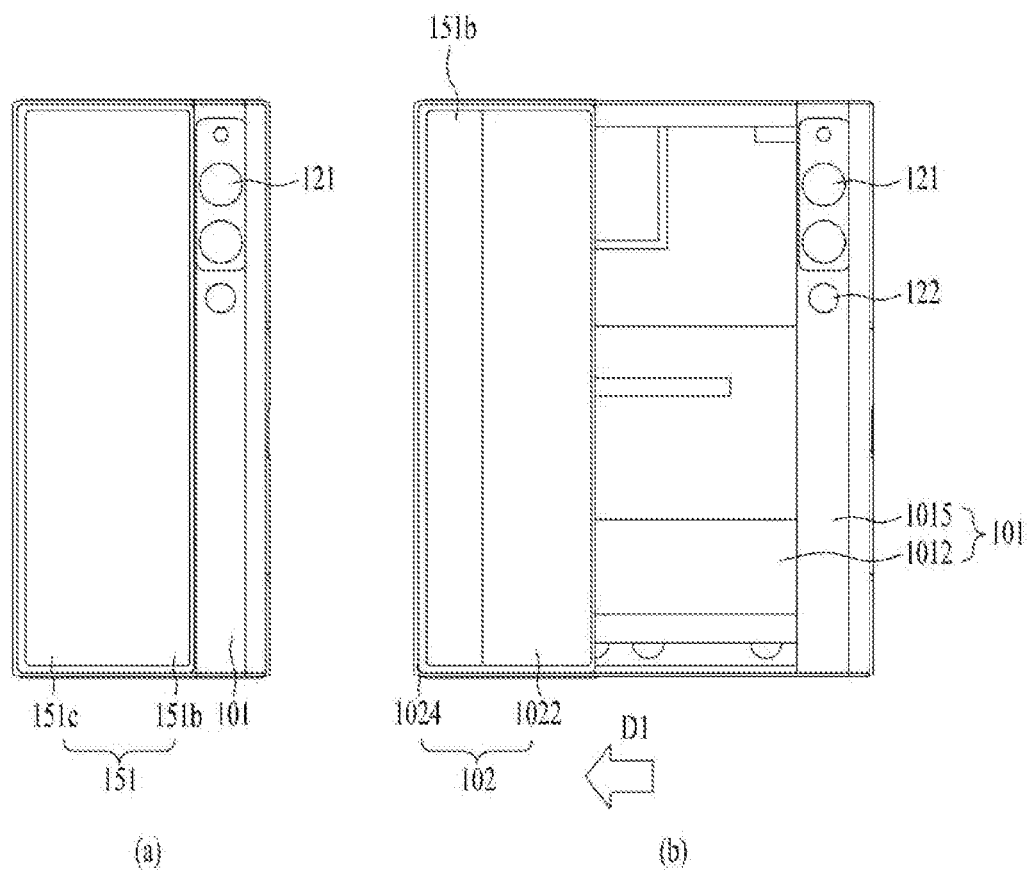
FIG. 3 is a rear view of the first state and the second state of the mobile terminal in accordance with an embodiment.

FIG. 2 is a front view of a first state and a second state of the mobile terminal in accordance with an embodiment, and FIG. 3 is a rear view of the first state and the second state of the mobile terminal in accordance with an embodiment. FIGS. 2(*a*) and 3(*a*) are views showing the first state in which the mobile terminal is contracted, and FIGS. 2(b) and 3(b) are views showing the second state in which the mobile terminal is extended.

As shown in the figures, the mobile terminal 100 in the first state is in a contracted position, and has a smaller size than the mobile terminal 100 in the second state. In addition, the size of the display unit 151 positioned on the front of the mobile terminal 100 is also smaller than in the second state. The mobile terminal 100 in the first state may be extended in a first direction D1 to switch to the second state. In the second state, as shown in FIG. 2(b), the size of the mobile terminal 100 and the size of the display unit 151 positioned on the front of the mobile terminal 100 are larger than in the first state, while the size of the display unit 151 positioned on the rear of the mobile terminal 100 is reduced as shown in FIG. 3(b). That is, a part of the display units 151 positioned on the rear of the mobile terminal 151 in the first state moves to the front of the mobile terminal 100 in the second state.

In the following description, the direction in which the mobile terminal 100 and the display unit 151 thereof are extended or enlarged is defined as a first direction D1, and the direction in which the mobile terminal contracts or retracts or is reduced to switch from the second state to the first state is defined as a second direction D2. A direction perpendicular to the first and second directions D1 and D2 is defined as a third and fourth directions. Description will be made on the assumption that the first and second directions are horizontal directions and the third and fourth directions are vertical directions. However, depending on the arrangement of the mobile terminal 100, the first and second directions may be vertical directions and the third direction may be a horizontal direction.

As such, a flexible display unit 151 which is bendable may be used as the display unit such that the position of the display unit may be varied. The flexible display unit 151 may be a display unit capable of maintaining a flat state like a conventional flat panel display and capable of warping, bending, folding, twisting, or rolling like paper. The flexible display unit 151 refers to a display which is manufactured on a thin and flexible substrate and is thus lightweight and robust as not to be easily broken. The flexible display unit according the present disclosure may be bent in a specific direction, and may be arranged such that the curvature thereof may change in the first direction.

In addition, an electronic paper is a display technology to which properties of general ink are applied. The electronic paper may be different from the conventional flat panel display in using reflected light. The electronic paper may change information using a twisted ball or electrophoresis using a capsule.

In a state in which the flexible display unit 151 is not deformed (e.g., a state of having an infinite curvature radius, hereinafter referred to as a basic state), a display region of the flexible display unit 151 becomes flat. In a state in which the flexible display unit 151 is deformed by an external force from the basic state (e.g., a state of having a finite radius of curvature, hereinafter referred to as a deformed state), the display region may become a curved face. As shown, information displayed in the deformation state may be visual information output on the curved face. Such visual information is implemented by independently controlling light emission of sub-pixels arranged in a matrix. The sub-pixel refers to a minimum unit for implementing one color. When external force is applied to the flexible display unit 151, the flexible display unit 151 may be deformed to switch from the default state, which is the flat state, to a bent state, which is not the flat state.

The flexible display unit 151 may be combined with a touch sensor to implement a flexible touch screen. When a touch is made on the flexible touch screen, the controller 180 (see FIG. 1) may perform control corresponding to such touch input. The flexible touch screen may be configured to detect the touch input in the deformed state as well as in the basic state.

The touch sensor detects the touch (or touch input) applied on the touch screen using at least one of various touch schemes such as a resistive film scheme, a capacitance scheme, an infrared scheme, an ultrasonic wave scheme, a magnetic field scheme, and the like.

As an example, the touch sensor may be configured to convert a change in pressure applied on a specific portion of the touch screen, capacitance generated at the specific portion, or the like into an electrical input signal. The touch sensor may be configured such that a touch object applying a touch on the touch screen may detect touched position and area on the touch sensor, a pressure during the touch, a capacitance during the touch, and the like.

Further, the mobile terminal 100 may have a deformation detection means for detecting the deformation of the flexible display unit 151. Such deformation detection means may be included in the sensing unit 140 (see FIG. 1).

The deformation detection means may be disposed in the flexible display unit 151 or a case (first to second frames 101 to 102 to be described later) to detect information related to the deformation of the flexible display unit 151. In this connection, the information related to the deformation may include a direction in which the flexible display unit 151 is deformed, a degree of the deformation, a deformed position, a deformed time, an acceleration at which the deformed flexible display unit 151 is restored, and the like. In addition, the information related to the deformation may include various kinds of information that may be detected due to the bending of the flexible display unit 151.

In addition, the controller 180 may change information displayed on the flexible display unit 151 or generate a control signal for controlling a function of the mobile terminal 100 based on the information related to the deformation of the flexible display unit 151 detected by the deformation detection means.

The deformation of the flexible display unit 151 may vary depending on the positions of the first frame 101 and the second frame 102. As shown in FIG. 2, since the bending position on the flexible display unit 151 is determined according to the positions of the first frame and the second frame, the bending deformation position of the flexible display unit 151 and the area thereof positioned on the front may be calculated based on the positions of the first frame 101 and the first frame 102 in place of the deformation detection means of the flexible display unit 151.

The state conversion (first or second state) of the flexible display unit 151, i.e., the size change at the front and rear faces of the mobile terminal 100 of the display unit 151 based on the size change of the mobile terminal 100 may be performed manually by a force applied by the user, but may be not limited to such manual scheme. For example, when the mobile terminal 100 or the flexible display unit 151 is in the first state, the mobile terminal 100 or the flexible display unit 151 may be converted into the second state by the user or an application command without the external force applied by the user. As such, in order for the flexible display unit 151 to be automatically deformed without the external force, the mobile terminal 100 may include a driving unit 200, which will be described later.

The flexible display unit 151 of the present disclosure is bent 180 degrees by rolling around a side portion of the mobile terminal 100 facing in the first direction. Accordingly, based on the side portion of the mobile terminal 100, a part of the flexible display unit 151 is disposed on the front of the mobile terminal 100, and the other part of the flexible display unit 151 is disposed on the rear of the mobile terminal 100. For simplicity, the part of the flexible display unit 151 positioned on the front is called a front face, and the other part of the flexible display unit 151 positioned on the rear is called a rear face. As illustrated in FIG. 2, the mobile terminal may extend in the first direction or contract in the second direction opposite to the first direction. In this case, the area of the flexible display unit 151 positioned on the front changes. That is, the sizes of the front face and the rear face may be changed according to a change in the state of the mobile terminal.

The part of the flexible display unit 151 positioned on the front of the mobile terminal 100 may be immovably fixed to the front surface of the first frame 101, and the other part thereof positioned on the rear of the mobile terminal 100 may be movably arranged on the rear of the mobile terminal 100.

In addition, the flexible display unit 151 may be rolled on or released at the side portion in the first direction of mobile terminal. Accordingly, the rear face of the display unit 151 moves, so that the size of the front face of the display unit 151 may be adjusted. Since the size of the flexible display unit 151 is determined and the flexible display unit 151 is formed of one continuous body, an area of rear face of the display unit 151 decreases as an area of the front face of the display unit 151 increases. Such a display unit 151 may be rolled in a second frame 102, which is movable relative to a first frame 101 to be described later, more correctly, on one of sides of the second frame 102. The display unit 151 may be withdrawn or pulled out from or inserted or pushed into the second frame 102 while being rolled in the second frame 102 along a moving direction of the second frame 102 to adjust the area of the display unit 151 on the front face of the mobile terminal 100. Such operation will be described in more detail below along with other relevant components of the mobile terminal 100.

Typically, an antenna is disposed in the case or the housing of the mobile terminal 100, but a portion where the antenna is installed in the case or the housing may be limited because of the flexible display unit 151 that covers not only the front face of the mobile terminal 100 but also the rear face thereof. For this reason, the antenna may be implemented on the flexible display unit 151. An antenna on display (AOD) is an antenna in which a transparent film is formed by stacking an electrode layer and a dielectric layer that have patterns engraved thereon, respectively. The antenna on display may be implemented thinner than an antenna implemented using a laser direct structuring (LDS) technology using a conventional copper nickel plating scheme, so that the antenna on display may not be exposed to the outside without affecting a thickness. In addition, the antenna on display may transmit and receive a signal directly to or from the display unit 151. Accordingly, the antenna on display may be used in the mobile terminal 100 in which the display unit 151 is located on the both faces of the mobile terminal 100 as in the present disclosure.

Figure 4:
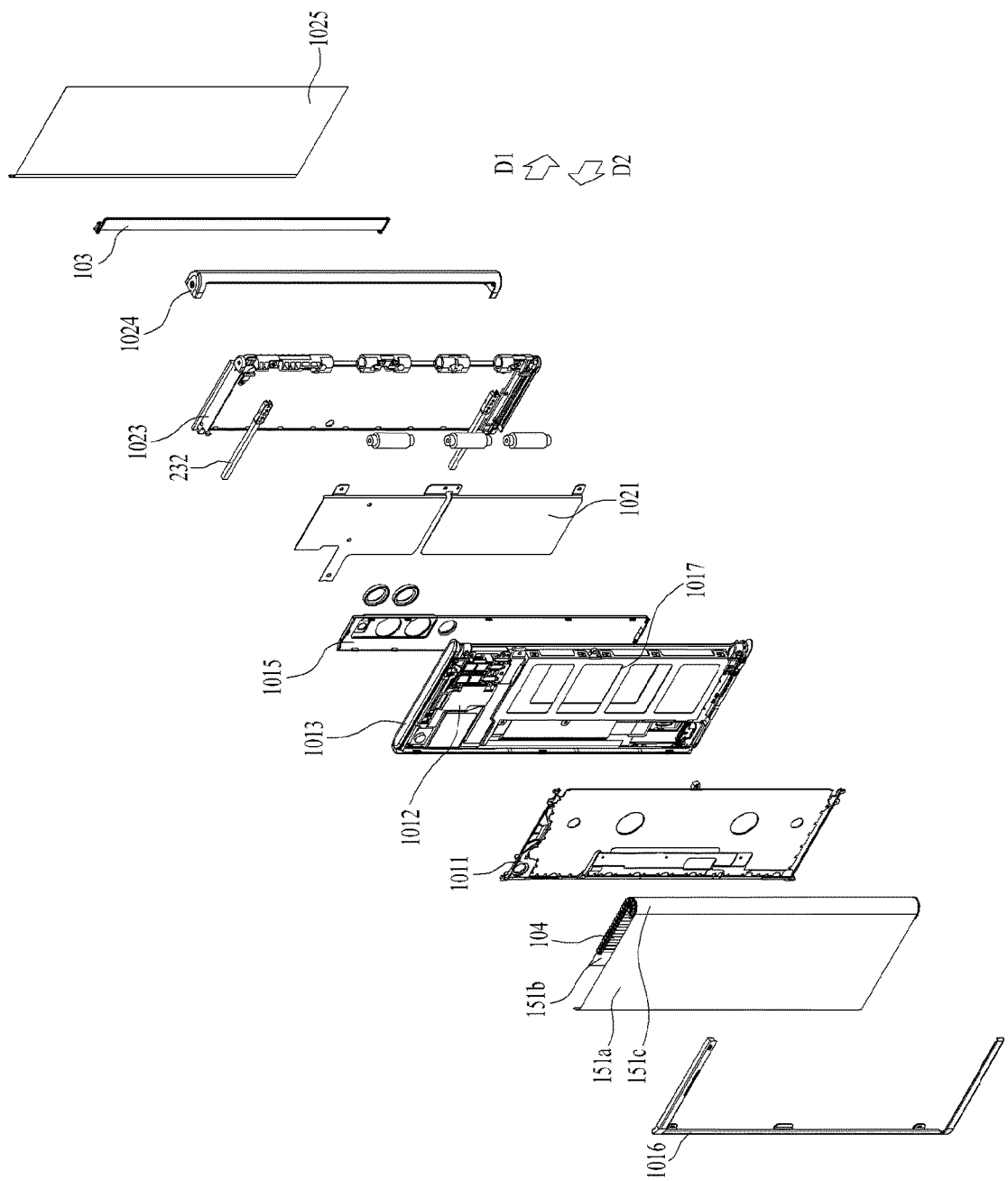
FIGS. 4 and 5 are exploded perspective views of the mobile terminal in accordance with an embodiment.
Figure 5:
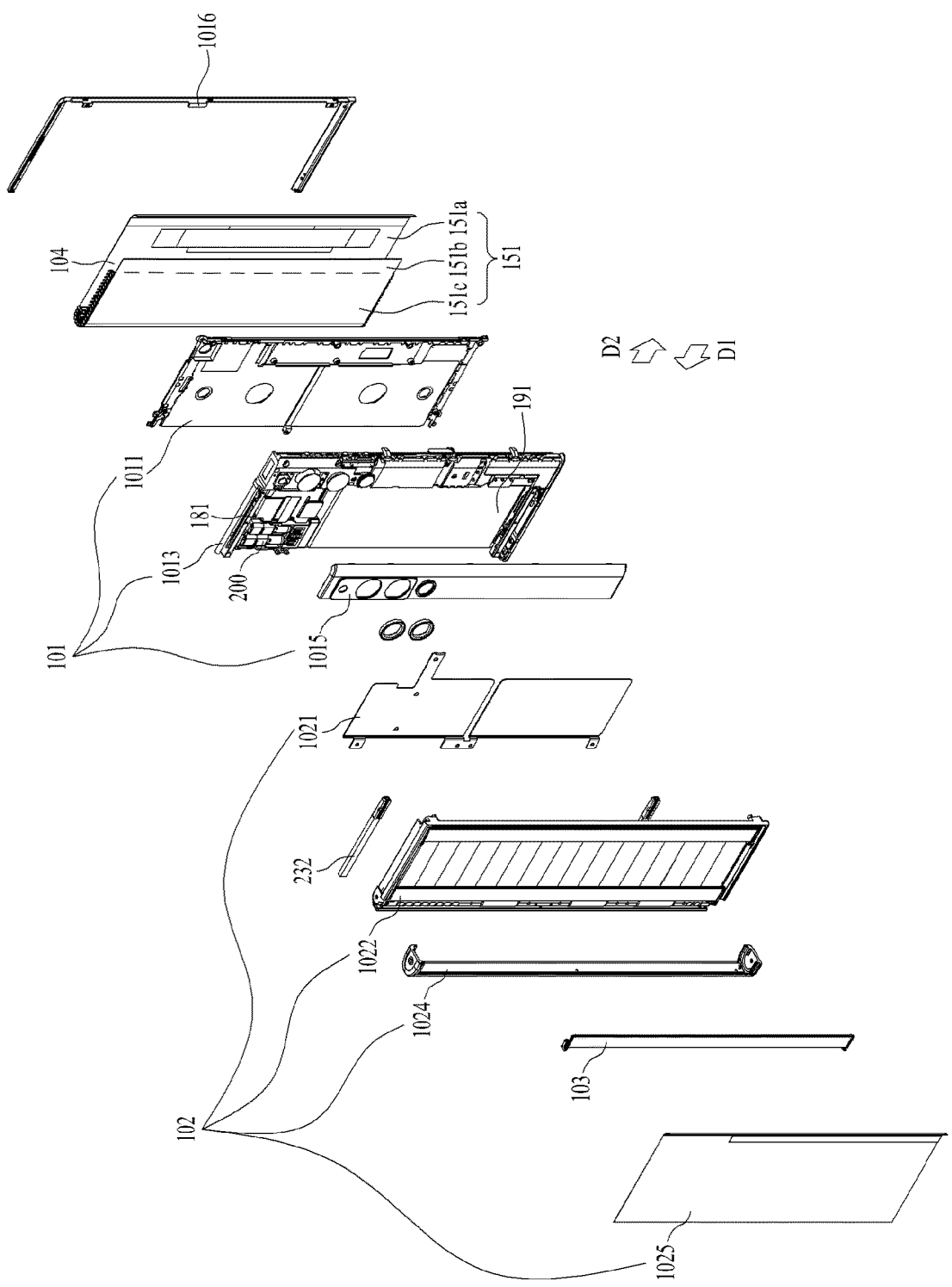

FIGS. 4 and 5 are exploded perspective views of the mobile terminal in accordance with an embodiment. FIG. 4 is an exploded perspective view of the mobile terminal as viewed from the front side, and FIG. 5 is an exploded perspective view of the mobile terminal as viewed from the rear side.

The mobile terminal 100 of the present disclosure includes frames 101 and 102 in which components are mounted, and the frames 101 and 102 of the present disclosure may vary in size in the first direction as shown in FIG. 2. One or more frames 101 and 102 move relative to each other, and sizes thereof may vary in the first direction. Electronic components are mounted in the frames 101 and 102, and the flexible display unit 151 is located out of the frames 101 and 102.

Since the mobile terminal 100 of the present disclosure includes the flexible display unit 151, the flexible display unit 151 may be combined in a form surrounding front faces and rear faces of the frames 101 and 102. The frame may include the first frame 101 and the second frame 102 moving in the first direction with respect to the first frame 101. The first frame 101 and the second frame 102 include front portions, a rear portions, and side portions, respectively, and are coupled to each other.

First, the first frame 101 corresponds to a main body of the mobile terminal 100, and may have a space between the first front portion 1011 and the first rear portion 1012 therein for accommodating various components. In addition, the first frame 101 may accommodate the second frame 102 movably coupled to the first frame 101 in such a space. More specifically, as shown in FIGS. 2 and 5, the first frame 101 may include a first front portion 1011 disposed at a front portion of the mobile terminal 100 and supporting the front face of the display unit 151 and a first rear portion 1012 disposed at a rear portion of the mobile terminal and on which various components are mounted. A front deco 1016 may cover front edges of the first area 151a to protect the edges of the first area 151a.

The first front portion 1011 and the first rear portion 1012 may be spaced apart from each other at a predetermined spacing to define a predetermined space therebetween, and may be connected to each other by a first side portion 1013. The first side portion 1013 may be integrally formed with the first rear portion 1012 or the first front portion 1011. The camera 121, the audio output module 152, and the input/output terminal, the controller 180, and the power supply unit 190 may be accommodated as components of the mobile terminal 100 in the space in the first frame 101. For example, the controller 180 may be a circuit board 181 including a processor and an electronic circuit for controlling the operation of the mobile terminal, and the power supply unit 190 may be a battery 191 and related components. In addition, the driving unit 200 that controls the slide movement of the second frame 102, which will be described later, may also be accommodated in the first frame 101.

As described above, the display unit 151 has the continuous body, and thus, may be disposed on both the front face and the rear face of the mobile terminal 100 while being rolled in the mobile terminal 100. The display unit 151 may include the front face positioned at the front face of the mobile terminal 100, the rear face positioned at the rear face of the mobile terminal 100, and the side face positioned between the front face and the rear face thereof and surrounding the side face of the mobile terminal. The front face and the rear face of the display unit 151 are flat, and the side face of the display unit 151 may form a curved face. The flexible display unit 151 may be damaged when being bent at an angle. Thus, the flexible display unit 151 may be formed to be bent with a predetermined curvature at the side face.

The display unit 151 may be divided into a fixed portion 151a and 151b and a variable portion 151c. The fixed portion 151a and 151b means a portion fixed to the frame. Because of being fixed to the frame, the fixed portion 151a and 151b maintains a constant shape without changing a bending degree. On the other hand, the variable portion 151c means a portion in which a bending angle or a position of the bent portion changes. The variable portion 151c in which the position or bending angle of the bent portion changes requires a structure for supporting a rear face of the variable portion 151c in response to the change.

The fixed portion 151a, 151b is coupled to the first frame of the display unit and is always positioned on the front face of the display unit to form a portion of the front face of the display unit. The variable portion 151c includes a side face located at a side portion of the mobile terminal, and a position of the side face varies depending on the position of the second frame. Based on a side face, an area of a portion disposed on the front face of the display unit and an area of a portion disposed on the rear face of the display unit vary. That is, a portion of the variable portion 151c may be the front face and another portion of the variable portion 151c may be the rear face based on the first and second states. The variable portion 151c is positioned in the first direction with respect to the fixed portion 151a, 151b relative to the mobile terminal, and an end of the variable portion 151c is bent toward the rear face of the mobile terminal and slides on the rear face of the second frame.

The end of the variable portion of the display unit is coupled with a slide frame that guides the variable portion to slide move on the rear face of the second frame, and the slide frame moves in the first direction at the same time as the second frame moves in the first direction. As a result, a moving distance of the slide frame with respect to the first frame is twice as a moving distance of the second frame with respect to the first frame. Further, as shown in FIG. 3, the first rear portion 1012 of the mobile terminal 100 includes an exposed rear portion 1015 that is exposed to the outside without being covered by the display unit 151 even in the first state. The physical input unit 120 for the manipulation of the mobile terminal 100 such as various buttons, switches, the camera 121, and a flash, and the sensing unit 140 such as the proximity sensor 141 or a fingerprint sensor may be arranged on the exposed rear portion 1015. The first rear portion 1012 except for the exposed rear portion 1015 may be covered by the display unit 151 in the first state as shown in FIG. 3(a), and may be exposed rearward in the second state as shown in FIG. 3(b).

In a conventional bar-shaped terminal, a display unit is provided only on a front face of the terminal. Therefore, a main camera is placed on a rear face of the terminal in order for the user to capture an object at an opposite side while looking through the display unit. On the other hand, an additional auxiliary camera is required to be disposed on the front face of the terminal in order for the user to capture himself or herself while viewing himself or herself through the display unit.

In the mobile terminal 100 of the present disclosure, on the other hand, the display unit 151 is arranged on both the front and rear of the mobile terminal 100. Accordingly, when a user photographs himself, a portion of the display unit 151 positioned on the same surface as the camera 121, that is, the rear face of the display unit 151 may be used. When the user takes a photograph of an object around the user, a portion of the display unit 151 on the side facing away from the camera 121, that is, the front face of the display unit 151 may be used. For this reason, the mobile terminal 100 may take a photograph of the user or an object located around the user using one camera 121. The camera may include a plurality of cameras having different angles of view, such as wide angle, ultra wide angle, and telephoto angle. Not only the camera but also a proximity sensor and an audio output unit may be disposed on the exposed rear portion 1015, and an antenna may be installed on the rear portion 1015. The rear portion 1015 may be used to protect the camera, the sensor, or the like on the exposed rear portion 1015 and not to deteriorate the exterior design. A portion of the rear portion 1015 corresponding to the camera 121 or the sensor 140 may be configured to be transparent, and the other portion thereof may have a predetermined pattern or color in consideration of design aspects without exposing internal parts.

The first side portion 1013 may extend along the edges of the first front portion 1011 and the first rear portion 1012 to surround the circumference of the first frame 101 and may define the appearance of the mobile terminal 100. However, as mentioned above, the second frame 102 is accommodated in and movably coupled to the first frame 101, and therefore a portion of the first frame 101 needs to be open to allow movement of the second frame 102 relative to the first frame 101. As an example, as best shown in FIG. 2, the second frame 102 may be movably coupled to a side of the first frame 101 facing in the first direction, and accordingly the first side portion 1013 may not be formed on the lateral surface facing in the first direction such that the lateral surface is open. Since the first side portion 1013 is exposed to the outside of the mobile terminal 100, the interface unit 160 for connecting a power port or an ear jack or the user input unit 120, such as a volume control button, may be disposed on the first side portion 1013. When the first side portion 1013 contains a metal material, the first side portion 1013 may serve as an antenna.

The second frame 102 may include a second front portion 1021 disposed at the front portion of the mobile terminal 100 and a second rear portion 1022 disposed at the rear portion of the mobile terminal 100. Like the first front portion 1011 and the first rear portion 1012 of the first frame 101, the second front portion 1021 and the second rear portion 1022 may be formed of plate-shaped members that are generally flat. In addition, the second frame 102 also accommodates various components, and must not interfere with the components accommodated in the first frame 101 during the movement. Accordingly, the second front portion 1021 and the second rear portion 1022 may be coupled to each other in a state of being spaced apart from each other to define a predetermined space therebetween, and may have shapes that do not interfere with the components in the first frame 101.

Figure 6:
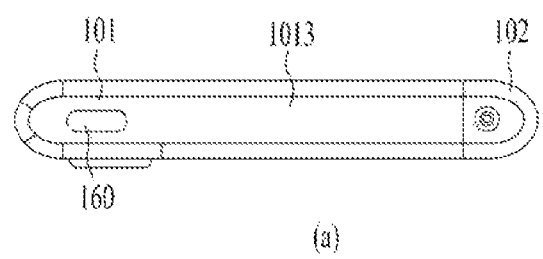
FIG. 6 is a side view of the mobile terminal as viewed from a third direction.
Figure 6:
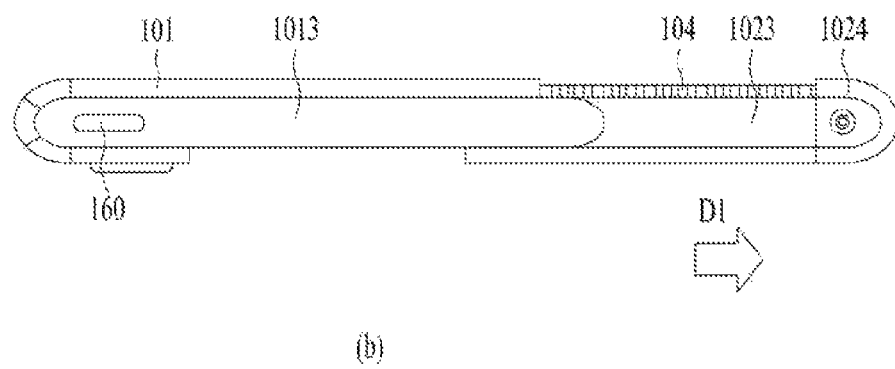

FIG. 6 is a side view of the mobile terminal as viewed from a third direction. FIG. 6 shows the first side portion 1013 of the first frame 101 and a second side portion 1023 of the second frame 102. Since the flexible display unit 151 is positioned at an end of the second frame 102 facing in the first direction, the end of the second frame 102 facing in the first direction should not be exposed to the outside. An end of the second frame 102 facing in the second direction should be open so as not to interfere with the first frame 101. In the first state, the second side portion 1023 of the second frame 102, which is positioned on the side facing in the third direction (which refers to the upward or downward direction in the drawing or may include both the upward and downward directions), may not be exposed to the outside because it overlaps the first side portion 1013 of the first frame. However, in the second state, it may be exposed to the outside because the second frame 102 is drawn out.

In addition, the display unit 151 may be bent 180 degrees while being rolled in the second frame 102 to be disposed on both the front face and the rear face of the mobile terminal 100. For such an arrangement of the display unit 151, the second frame 102 may include a roller 210 rotatably disposed therein. The roller 210 may be disposed at any position inside the second frame 102. However, the display unit 151 should be spread flat on the front face and the rear face of the mobile terminal 100 to provide a good quality screen to the user. Further, for such spread, a proper tension must be provided on the display unit 151. In order to provide the proper tension, the roller 210 may be disposed at a first directional end of the second frame 102. The roller 210 may extend in the third direction, and may be rotatably coupled to the second frame 102.

The display unit 151 may be rolled around the roller 210 while being gently bent with a predetermined curvature. The flexible display unit 151 may include a first face on which a video is output and exposed to the outside and an inner face facing the frame at the opposite side. The roller 210 may be installed to rotate freely in the second frame 102 while being in contact with the inner face of the display unit 151. Accordingly, the roller 210 may actually move the display unit 151 in a lateral direction of the mobile terminal 100, that is, in a direction perpendicular to a longitudinal direction. As will be described later, when the second frame 102 slides, because of the tension applied by the second frame 102, the display unit 151 moves to the front face or the rear face of the mobile terminal 100 in different directions (i.e., the first direction D1 or the second direction D2) relative to the second frame 102. The roller 210 may guide such movement while rotating.

The roller 210 may be disposed adjacent to the end of the second frame 102 that faces in the first direction. A side frame 1024 may be disposed at the end of the second frame 102 facing in the first direction to prevent damage to the display unit 151 rolled around the roller 210.

The side frame 1024 may extend in the longitudinal direction (the third direction) of the second frame 102 to cover the side portion facing in the first direction, thereby protecting the roller 210 and the display unit 151 rolled therearound.

The side frame 1024 may substantially define the appearance of the mobile terminal 100 in cooperation with the first side portion 1013 of the first frame 101. In addition, the side portion of the second frame 102 that faces in the second direction may be omitted to minimize interference with the components arranged in the first frame 101 during movement.

During the expansion and the contraction in such first and second directions D1 and D2, the second frame 102 may overlap the first frame 101, more precisely, the first front portion 1011 and the first rear portion 1012 thereof so as not to interfere with the first frame 101. More specifically, the display unit 151 may be coupled to and supported by the first front portion 1011 of the first frame 101, as described above. Accordingly, the display unit 151 does not need to be additionally supported by the second front portion 1021 of the second frame 102. Rather, when the second front portion 1021 is interposed between the first front portion 1011 and the display unit 151, the display unit 151 may be deformed or damaged because of friction with the second front portion 1021, which is repeatedly moved. Thus, the second front portion 1021 may be disposed below the first front portion 1011, or may be interposed between two first front portions 1011. The second rear portion 1022 of the second frame 102 may be disposed rearward of the first rear portion 1012 of the first frame 101. That is, the front face of the second rear portion 1022 may face the rear face of the first rear portion 1012. In addition, the rear face of the first rear portion 1012 may be in contact with the front face of the second rear portion 1022 to stably support the movement of the second frame 102. Because of such arrangement, the second rear portion 1022 may be exposed to the outside of the first frame, more precisely, of the first rear portion 1012, and may be coupled to the display unit 151.

In addition, the second frame 102 may extend and contract in the first and second directions D1 and D2 to change the size of the mobile terminal 100, particularly, to extend or contract the front face of the mobile terminal 100. Thus, the display unit 151 must move by such extended or reduced front face size to obtain the intended first and second states. However, when being fixed to the second frame 102, the display unit 151 may not be moved smoothly to be adapted for the front face of the mobile terminal 100 that is extended or contracted. For this reason, the display unit 151 may be movably coupled to the second frame 102.

More specifically, the display unit 151 may include a first region 151a disposed on the front of the mobile terminal 100, a second region 151b coupled to a slide frame 103 positioned on the rear of the mobile terminal 100, and a third region 151c located between the first region 151a and the second region 151b and bent around the roller 210. The third region 151c may move to the front or the rear according to change in the state of the mobile terminal 100. The slide frame 103 may be formed of a plate-shaped member extending in the longitudinal direction (the third direction) of the mobile terminal 100, and may be coupled to the second rear portion 1022 so as to be movable in the first and second directions D1 and D2.

The first to third regions 151a, 151b, and 151c may be connected to each other, and may form a continuous body of the display unit 151. In addition, as described above, for the movement of the third region 151c toward the front face or the rear face of the mobile terminal 100 depending on the moving direction of the second frame 102, the first region 151a may be fixed so as not to move to the front face of the mobile terminal 100, and the second region 151b may be provided to be movable on the rear face of the mobile terminal. Such configuration of the display unit 151 will be described in more detail below.

The first region 151a may be disposed on the front face of the mobile terminal 100, more specifically, the first frame 101, that is, on the front face of the first front portion 1011. The first region 151a is fixed to the first frame 101, that is, the front face of the first front portion 1011 so as not to be moved during the movement of the second frame 102, and thus, the first region 151a may always be exposed to the front face of the mobile terminal 100.

The third region 151c may be adjacent to the first region 151a in a direction of a second end 151e. The third region 151c may extend into the second frame 102 and be rolled on the roller 210. The third region 151c may extend out of the second frame 102 and partially cover the second frame 102, that is, the rear front of the second rear portion 1022. Since the second frame 102, i.e., the second rear portion 1022 is adjacent to the first frame 101, i.e., the first rear portion 1012, and the first and second frames 101 and 102 form the rear case of the mobile terminal 100, it may be said that the third region 151c is also disposed on the rear front of the first frame 101.

The second region 151b may be adjacent to the third region 151c and may be disposed on the rear face of the mobile terminal 100, more specifically, on the second frame 102, that is, the rear face of the second rear portion 1022 thereof. The second region 151b may be coupled to the slide frame 103 without being directly coupled to the second frame 102.

As a result, the first region 151a may be disposed on the front face of the mobile terminal 100 and may be always exposed to the front face regardless of the movement of the second frame 102, and the second region 151b may be disposed on the rear face of the mobile terminal 100 and may be always exposed to the rear face regardless of the movement of the second frame 102. In addition, the third region 151c may be disposed between the first and second regions 151a and 151b, and may be selectively placed on the front face or the rear face of the mobile terminal 100 depending on the moving directions D1 and D2 of the second frame 102.

Because of such selective placement of the third region 151c, the first rear portion 1012 of the first frame 101 may be exposed to the outside of the mobile terminal 100 because the first rear portion 1012 is covered by the second and third regions 151b and 151c and the second rear portion 1022 of the display unit 151 in the first state, but, in the second state, the third region 151c moves to the front face of the mobile terminal 100 and the second rear portion 1022 also moves in the first direction D1. In addition, the second front portion 1021 of the second frame 102 is hidden by the first front portion 1011 of the first frame 101 in the first state, but, in the second state, moves out of the first frame 101 to support the third region 151c of the display unit 151 disposed on the front face of the mobile terminal 100.

In order to prevent the second front portion 1021 from affecting the internal components during the slide movement, a separating plate 1017 may be further disposed rearward of the second front portion 1021 and fastened with the first front portion 1011. The second front portion 1021 may move between the first front portion 1011 and the separating plate 1017 based on the slide movement of the second frame.

However, the third region 151c may be rolled on the roller 210 and bent in the second frame 102. When converting from the first state to the second state, the third region 151c may extend from the second frame 102 to the front face of the mobile terminal 100 while being rolled on the roller 210 in one direction. On the other hand, when converting from the second state to the first state, the third region 151c may be retracted from the front face of the mobile terminal 100 to the second frame 102 while being rolled on the roller 210 in the opposite direction, and at the same time, may return to the rear face of the mobile terminal 100 from the second frame 102.

A specific location of the foldable mobile terminal in a form of being spread like a book is easily damaged because only the specific location is folded repeatedly. On the other hand, the deformed portion of the flexible display unit 151, that is, a portion rolled on the roller 210, may vary based on the first and second states of the mobile terminal 100, that is, the movement of the second frame 102. Accordingly, the mobile terminal 100 of the present disclosure may significantly reduce deformation and fatigue repeatedly applied to a specific portion of the display unit 151, thereby preventing damage to the display unit 151.

Based on the above-described configuration, overall operations of the mobile terminal 100 will be described as follows. As an example, the state conversion may be performed manually by the user, and an operation of the mobile terminal 100 during such manual state conversion will be described. However, operations of the first to third frames 101 to 103 and the display unit 151, which will be described below, may be performed in the same manner when a power source other than a user's force is used, for example, when the driving unit 200 to be described below is applied.

A rear face cover 1025 may be further disposed on a rear face of the second rear portion 1022 such that the rear face of the display unit positioned on the rear face of the mobile terminal 100 is not exposed to the outside. The rear face of the display unit may be used in the first state when the rear face cover 1025 uses a transparent material, and the rear face of the display unit may be covered such that the movement of the slide frame 103 is not exposed when the rear face cover 1025 uses an opaque material. That is, the second region and the third region of the slide frame 103 and the display unit 151 may move in the first direction and in the second direction in a space between the second rear portion 1022 and the rear face cover 1025.

Figure 7:
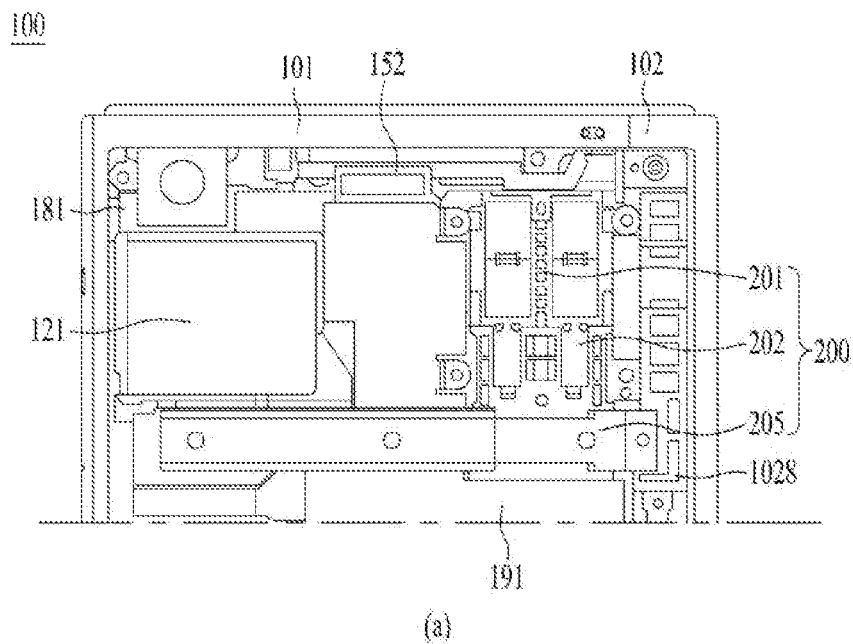
FIG. 7 is a view showing a driving unit of the mobile terminal in accordance with an embodiment.
Figure 7:
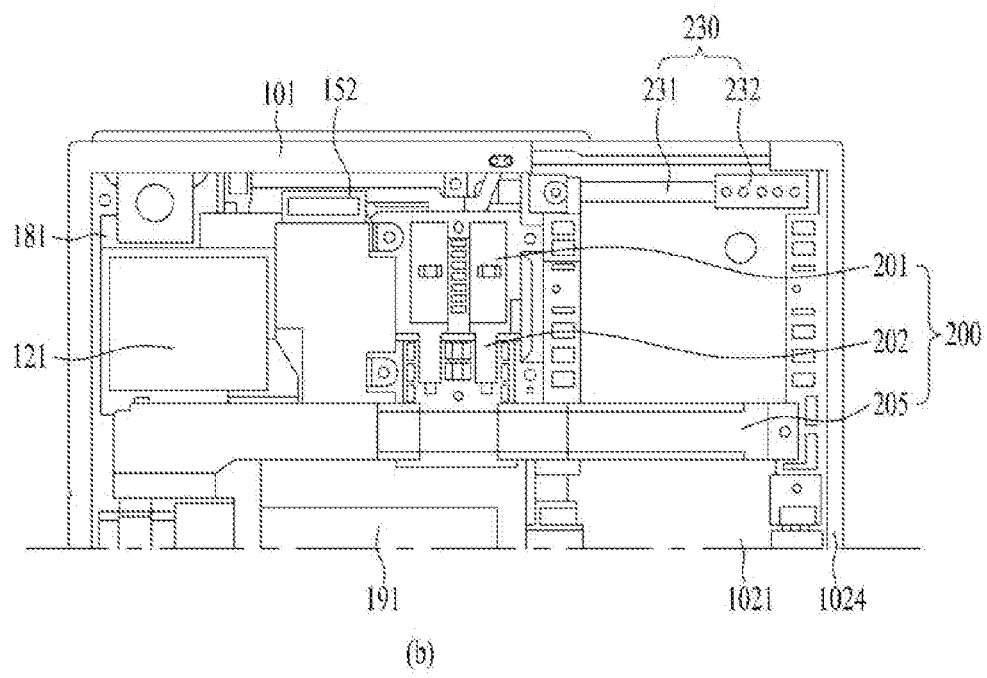

FIG. 7 is a view showing a driving unit 200 of the mobile terminal 100 in accordance with an embodiment. FIG. 7(a) shows the first state and FIG. 7(b) shows the second state. The mobile terminal 100 of the present disclosure may be switched between the states in a manner in which a user manually pulls the second frame 102 in the first direction D1 or pushes the same in the second direction D2 with respect to the first frame 101. However, in the manual method, applying excessive force to the body of the mobile terminal 100 may damage the mobile terminal 100. Accordingly, a driving unit 200 employing a motor 201 may be further provided to cause the second frame 102 to stably move without distortion.

As the motor 201, a motor 201 configured to provide rotational force as shown in FIG. 7, or a linear motor 201 configured to make linear motion may be used. The motor 201 configured to provide the rotational force should have a large diameter to provide large force. Two motors 201 may be used as shown in FIG. 7 to provide driving force of a predetermined magnitude or more in the limited space of the mobile terminal 100 without increasing the thickness.

If the second frame 102 is moved excessively fast, damage or malfunction may occur. Accordingly, a planetary gear configured to decrease the speed of the motor 201 to ensure movement at a stable speed may be further provided. The planetary gear 202 serves to amplify or attenuate the number of revolutions of the motor 201 using a plurality of disc gears having different numbers of teeth. The motor 201 may be fixed to the first frame 101 as shown in FIG. 7(a). The position of the motor 201 is fixed even when the second frame 102 moves in the first direction to switch the mobile terminal 100 to the second state, as shown in FIG. 7(b).

Since the second frame 102 linearly moves with respect to the first frame 101 in the first direction or the second direction, rack and pinion gears configured to convert the rotational force of the motor 201 into linear motion may be used. A pinion gear to receive the rotational force of the motor 201 may be arranged to engage with a rack gear 205 composed of teeth continuously arranged in the first direction. The pinion gear may be fixed to the first frame 101 together with the motor 201 and the rack gear 205 may be positioned on the second frame 102. Alternatively, the rack gear 205 may be positioned on the first frame 101, and the motor 201 and the pinion gear may be arranged on the second frame 102. Since the motor 201 holds the pinion gear such that the pinion gear does not rotate, the second frame 102 may maintain the first state and the second state. However, when large external force is applied, the second frame 102 may be displaced as the pinion gear rotates.

A stopper (not shown) configured to fix the positions of the second frame 102 or the rack gear 205 and the first frame 101 may be further provided to fix the mobile terminal 100 in the first state or the second state. When electric current flows through the motor 201 to drive the motor 201, the stopper may be released to allow the movement of the second frame 102. When power is not applied to the motor 201 and thus the motor 201 does not rotate, the first frame 101 and the second frame 102 may be fastened such that the positions thereof are fixed.

When a pair of driving units 200 is symmetrically disposed in the vertical direction (the third direction), stable movement may be made. However, to arrange a battery or the like, the driving unit 200 should be arranged biased to one side in consideration of the limited mounting space of the mobile terminal 100 as shown in FIG. 7(*a*). According to such asymmetric arrangement of the driving unit 200, the second frame 102 may be distorted during movement due to a difference in movement speed between the upper end portion and the lower end portion. To address this issue, a linear guide 230 may be further provided.

The linear guide 230 may be disposed at both ends of the mobile terminal 100 facing in the third direction, that is, on the upper and lower sides of the mobile terminal 100, in order to supplement the function of one driving unit 200 biased to one side in the third direction. The linear guide 230 may include a guide rail 231 extending in the first direction and a guide block 232 configured to move along the guide rail 231. The guide rail 231 may be disposed on the first frame 101 and the guide block 232 may be disposed on the second frame 102, or vice versa. In this embodiment, the guide rail 231 may be disposed on the second frame 102 to cover the upper and lower sides of the extended portion of the second frame 102 in the second state.

After the guide block 232 is coupled to the first frame 101 and the guide rail 231 is coupled to the second frame 102, the guide block 232 and the guide rail 231 may be slidably fastened to each other. However, for convenience of the fastening, the guide block 232 and the guide rail 231 fastened to each other. Then, the guide block 232 may be first fixed to the first frame 101, and then the second frame 102 may be coupled to the guide rail 231.

The guide block 232 may be provided with a guide groove into which the guide rail 231 is inserted. Alternatively, the guide rail 231 may be provided with a rail groove into which a portion of the guide block 232 is inserted. The fastening portions of the guide rail 231 and the guide block 232 may be formed to be bumpy. Accordingly, movement in the first direction or the second direction may be made without displacement in the thickness direction of the mobile terminal 100. In order to reduce friction between the guide block 232 and the guide rail 231, a self-lubricating member having high wear resistance and low friction resistance, such as a bearing or polyoxymethylene (POM), may be added to the inside of the guide groove.

Figure 8:
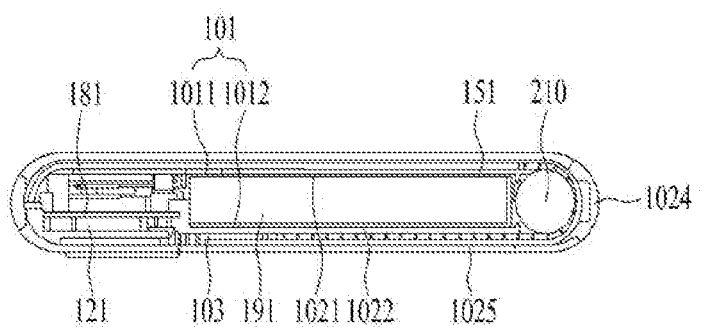
FIG. 8 is a cross-sectional view taken along lines A-A and B-B in FIG. 2.
Figure 8:
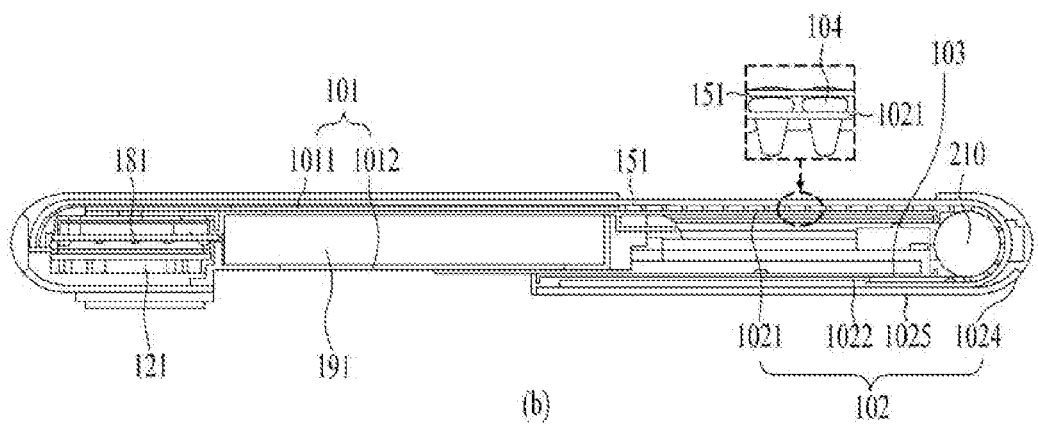

FIG. 8 is a cross-sectional view taken along lines A-A and B-B in FIG. 2. As illustrated in FIG. 2, when the second frame 102 switches to the second state by moving in the first direction, the third region 151*c* positioned on the rear side moves to the front, and thus a structure to support the rear surface of the third region 151*c* moved to the front is required. The second front portion 1021 positioned on the front surface of the second frame 102 may be positioned on the rear surface of the third region 151*c* in the second state. However, in the first state, the second front portion 1021 is disposed to overlap the first front portion 1011 of the first frame 101, and accordingly the first front portion 1011 and the second front portion 1021 form a step. A boundary is formed between the first region 151*a* and the third region 151*c* of the flexible display unit 151 by the step formed by the first front portion 1011 and the second front portion 1021. A rolling hinge 104 may be used as a support structure to fill the gap between the second front portion 1021 and the third region 151*c* of the flexible display unit 151.

The rolling hinge 104 may be positioned on the rear surface of the flexible display unit 151, and have a thickness corresponding to the gap between the second front portion 1021 and the flexible display unit 151 in the second state. As shown in FIG. 8(*a*), in the first state, the rolling hinge 104 is rolled around the roller 210 and is positioned on the lateral side and rear side of the mobile terminal 100. The flexible display unit 151 and the rolling hinge 104 may be positioned between the second rear portion of the second frame 102 and a rear cover 1025 provided to cover the rear face of the display unit 151. As shown in FIG. 8(*b*), when switch to the second state occurs, the rolling hinge 104 may move to the front and the rolling hinge 104 may be positioned on the front portion of the second frame 102.

The third region 151*c* of the display unit 151 in which the rolling hinge 104 is positioned is a portion where bending deformation occurs when switch from the first state to the second state occurs. Accordingly, the rolling hinge 104 may be deformed according to deformation of the third region 151*c*. Here, the rolling hinge 104 is required to have a predetermined stiffness to maintain the flat state when the flexible display unit 151 is positioned on the front or rear of the mobile terminal. That is, the rolling hinge 104 needs a structure capable of maintaining the flat state in the third direction and performing bending deformation in the first direction.

Figure 9:
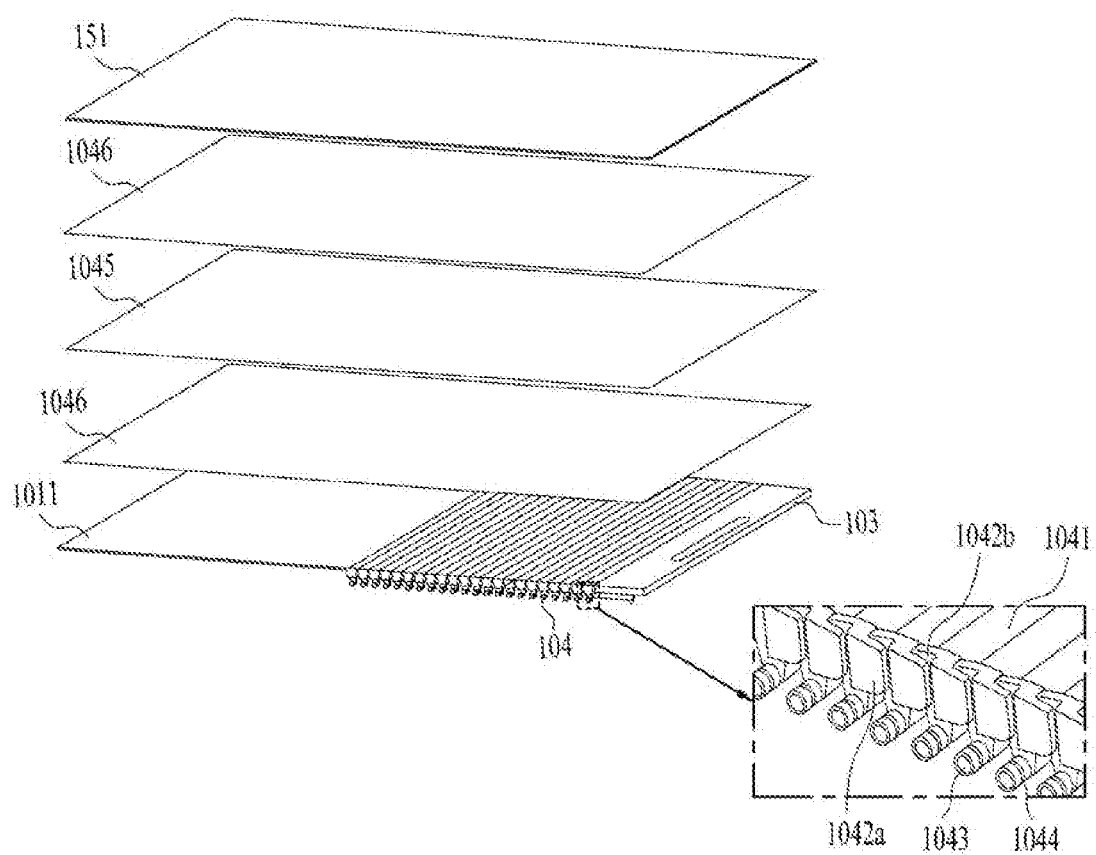
FIG. 9 is a view illustrating a display unit and a rolling plate of the mobile terminal in accordance with an embodiment.

FIG. 9 is a view illustrating a display unit 151 and a rolling hinge 104 of the mobile terminal 100 in accordance with an embodiment. The rolling hinge 104 may include multiple support bars 1041 extending in the third direction. The multiple support bars 1041 may be arranged side by side in the first direction and spaced apart from each other by a predetermined distance. Accordingly, even when the flexible display unit 151 is rolled around the roller 210 and is thus bent, interference between the support bars 1041 may be avoided. The support bars 1041 may be implemented with an injection molding material having a predetermined thickness for stiffness, and may include materials such as SUS or ferrosilicon (FeSi).

Ferrosilicon is an alloy of iron and silicon, and ferrite is a kind of ferrosilicon. Since ferrite has magnetic properties, it may protect mobile terminals from magnetism.

A liquid metal is a new alloy obtained by mixing zirconium with titanium, nickel, copper, etc. The surface of the liquid metal is smooth like liquid. The liquid metal is lighter than iron and has strength three times higher or more than that of iron. Further, like plastic, the shape of the liquid metal is free to change at high temperatures.

An amorphous metal is a metal with a disordered atomic structure. In general, a metal has a crystalline structure in which atoms are regularly arranged. When the metal becomes a liquid at high temperatures, the metal has an amorphous atomic structure. When such a metal is cooled down at a normal rate, the metal reverts to the original crystalline structure. However, if the metal is instantaneously cooled down, the metal is solidified while maintaining the amorphous atomic structure. The amorphous metal is superior to the crystalline metal in terms of tensile strength, anti-abrasion durability, and magnetic performance.

The multiple support bars 1041 may be directly attached to the rear surface of the display unit 151. However, this operation may take a long time and produce a lot of defects, resulting in poor productivity. In addition, directly processing the display unit 151 is highly likely to damage the display unit 151. Therefore, a rolling sheet 1045 to fix the multiple support bars 1041 may be further provided. The rolling sheet 1045 may include a metal material, and may employ a superelastic material that is bending-deformable and capable of recovering the flat state after the bending deformation. For example, a superelastic metal sheet such as a thin STS sheet of 0.05 mm or less may be used. An adhesive tape may be attached to both surfaces of the rolling sheet 1045 to bond the rolling sheet 1045 to the support bars 1041 and bond the rear surface of the display unit 151 to the rolling sheet 1045.

The rolling sheet 1045 may be provided with a kerf pattern in which multiple grooves extending in the third direction are formed in the first direction. The grooves in the kerf pattern may be formed between the multiple support bars 1041. The grooves may be formed on a surface of the rolling sheet 1045 to which the support bars 1041 are bonded. The kerf pattern may be formed in a wedge shape that is formed by being gradually narrowed from the surface portion of the rolling sheet 1045.

Alternatively, a plurality of holes may be formed in the rolling sheet 1045 and arranged in the first direction, each of which is elongated in the third direction, thereby facilitating bending deformation in the first direction.

Instead of the rolling sheet 1045, an elastic material such as silicone may be disposed between the support bars 1041 to join neighboring support bars 1041. In this case, the angle between the support bars 1041 may be varied. The elastic connector may be bent at a position corresponding to the roller 210. When positioned on the front or rear of the mobile terminal, the elastic connector may be unfolded such that the support bars 1041 are disposed forming a flat surface.

The support bars 1041 may form a flat surface corresponding to the rear surface of the display unit 151. Alternatively, as shown in FIG. 8(b), the support bars 1041 may be formed in a shape having a predetermined curvature. The curved support bars 1041 may closely contact the curved surface of the roller 210 when the rolling hinge 104 is rolled around the roller 210. Alternatively, one surface of the support bars 1041 in contact with the display unit 151 maintains a flat state, and the other surface thereof on the opposite side may include a curved surface corresponding to the curvature of the roller 210. In this case, the support bars 1041 may be thick at the ends thereof facing in the first and second directions and have the thinnest portion in the middle thereof.

The rolling hinge 104 may be disposed at a position corresponding to the third region 151c and is rolled and bent around the roller 210. Thus, the rolling hinge 104 may span over the front and rear surfaces. The rolling hinge 104 is connected to the first front portion 1011 of the first frame 101 on the front side and connected to the slide frame 103 on the rear side.

In order for the flexible display unit 151 to form a continuous surface without a step, the first front portion 1011 of the first frame 101 positioned on the rear surface of the first region 151a, the slide frame 103 positioned on the rear surface of the second region 151b, and the rolling hinge 104 positioned on the rear surface of the third region 151c may be arranged such that the surfaces thereof in contact with the display unit 151 are at the same height.

In particular, since the slide frame 103 moves on the rear of the mobile terminal 100 and moves in the same space as the rolling hinge 104, the rolling hinge 104 may have a thickness corresponding to the thickness of the slide frame 103.

Figure 10:
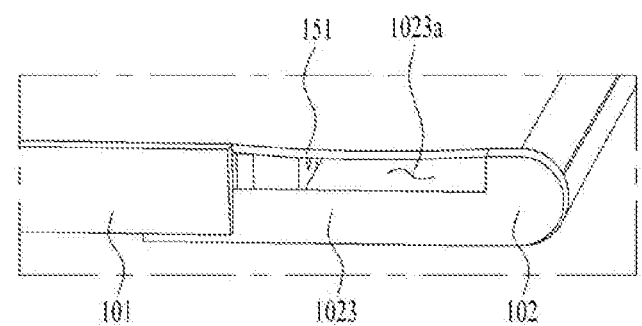
FIG. 10 is a view illustrating an issue raised in an extendable mobile terminal.
Figure 10:
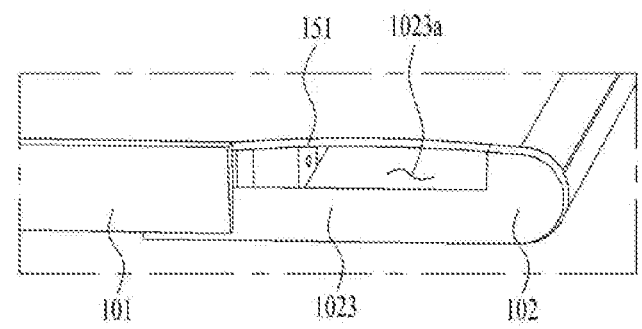

FIG. 10 is a view illustrating an issue raised in an extendable mobile terminal 100. The figure shows the end of the second frame 102 facing in the third direction when the second frame 102 positioned overlapping the first frame 101 is extended as switching from the first state to the second state occurs. Since the display unit 151 contains a flexible material, the display unit 151 may be bent at a position corresponding to the roller 210. However, when the display unit 151 is positioned on the front of the mobile terminal 100 in the second state, it should be maintained in a flat state. Since the rolling hinge 104 is not fixed to the second frame 102, the display unit 151 may sag downward as shown in FIG. 10(a) or rise upward as shown in FIG. 10(b).

Since the support bar 1041 of the rolling hinge 104 supports the rear surface of the third region 151c of the display unit 151 as described above, the deflection of the display unit 151 (see FIG. 10(a)) may be somewhat mitigated. However, since the support bar 1041 is elongated in the third direction, the center part of the display unit 151 may fall down. To support the rear surface of the extended third region 151c, a foldable link supporter 250 may be employed.

Figure 11:
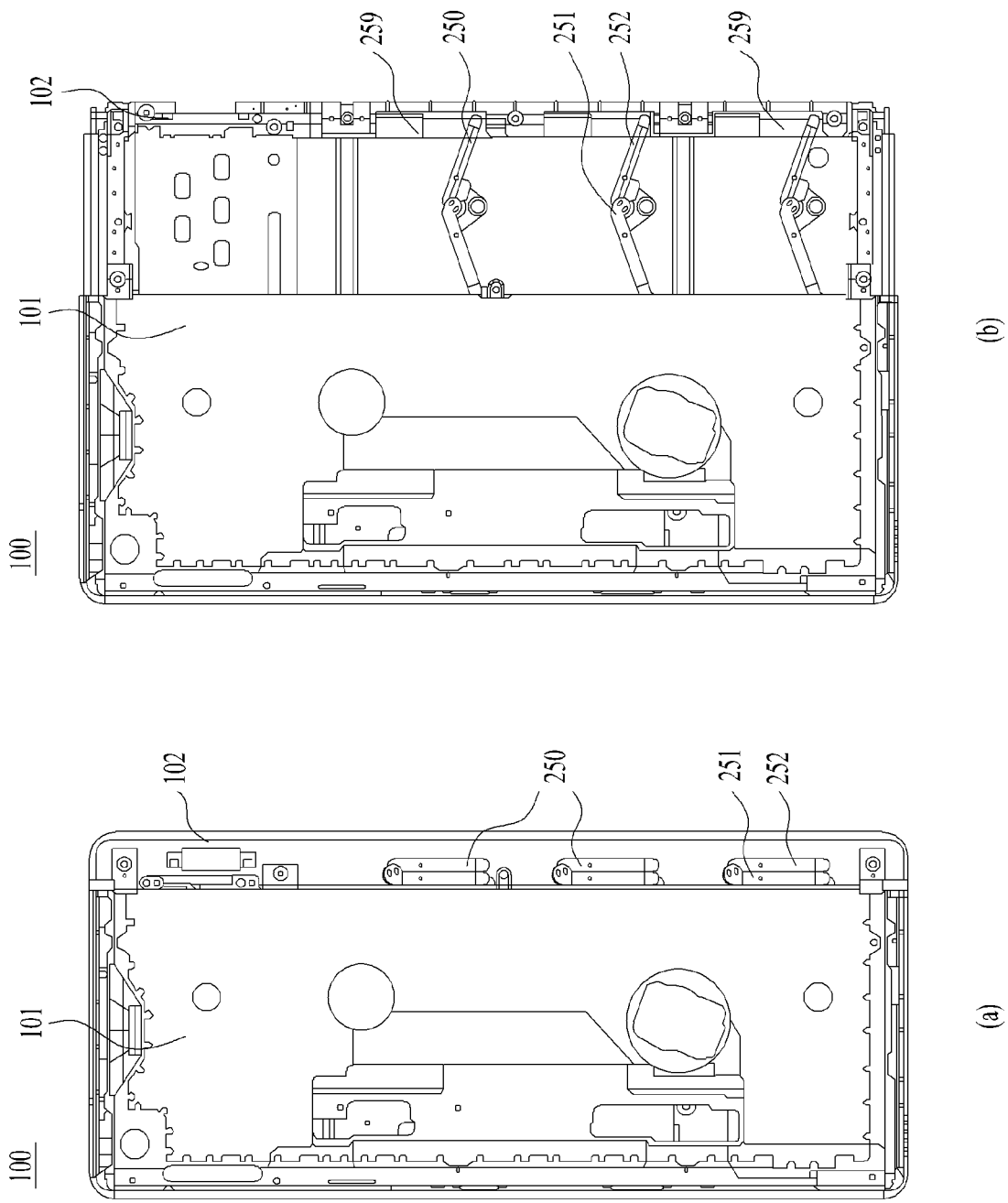
FIG. 11 is a view illustrating a first frame and a second frame without the display unit when the mobile terminal is in the first and second states.

FIG. 11 is a view illustrating the first and second frames 101 and 102 without the display unit 151 when the mobile terminal 100 is in the first and second states. FIG. 11(a) shows the first and second frames 101 and 102 in the first state, and FIG. 11(b) shows the first and second frames 101 and 102 in the second state. The arrangement and shape of the link supporter 250, which is disposed between the first and second frames 101 and 102, may differ in the first and second states.

At least one link supporter 250 may be provided, and more particularly, a plurality of link supporters 250 may be arranged in the third direction as shown in FIG. 11. When the second frame 102 is extended, a rack gear 205 of the driving unit 200 may move together with the second frame 102 in the first direction. Thus, the link supporter 250 may be disposed in an area in which the driving unit 200 is not disposed such that the link supporter 250 does not overlap with the rack gear 205.

To minimize the distance between the first and second frames 101 and 102 in the first state, a link storage space 259 for storing the link supporter 250 may be provided at the lateral end of the second frame 102 facing in the first direction. In the first state, the link supporter 250 is folded and stored in the link storage space 259. The link supporter 250 is coupled to the second frame 200 within the link storage space 259.

Figure 12:
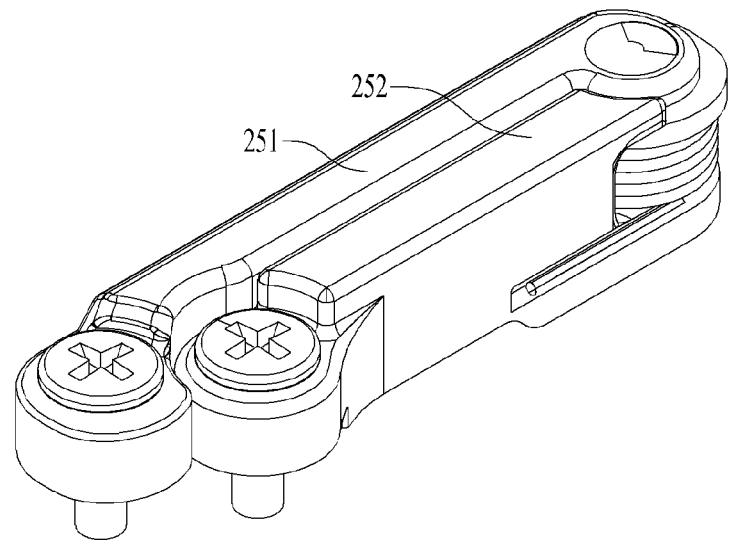
FIG. 12 is a perspective view showing a link supporter of the mobile terminal.
Figure 12:
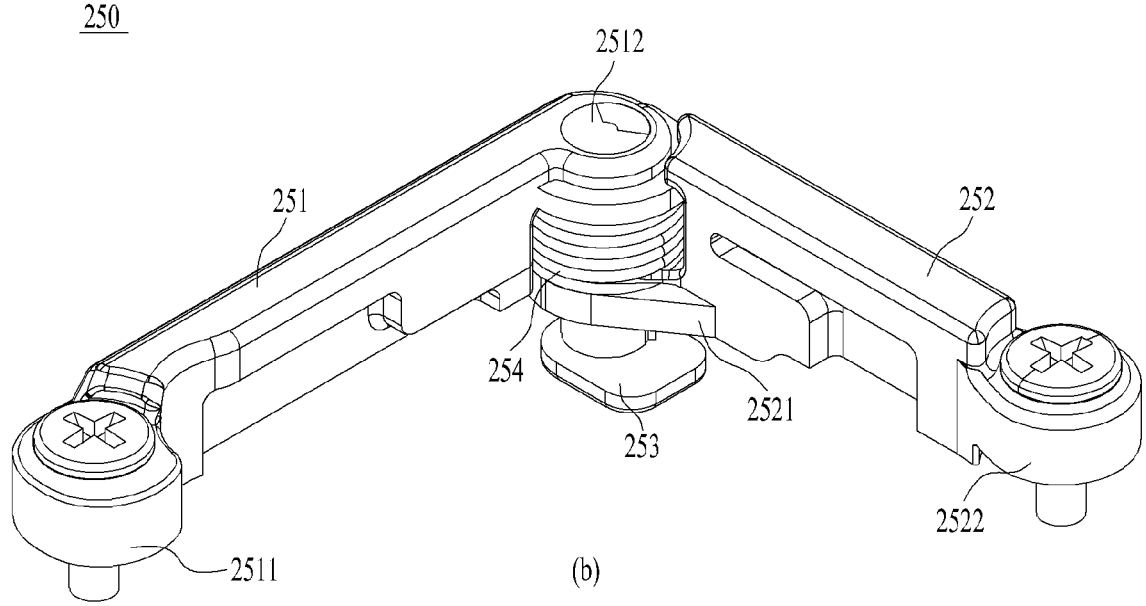
Figure 13:
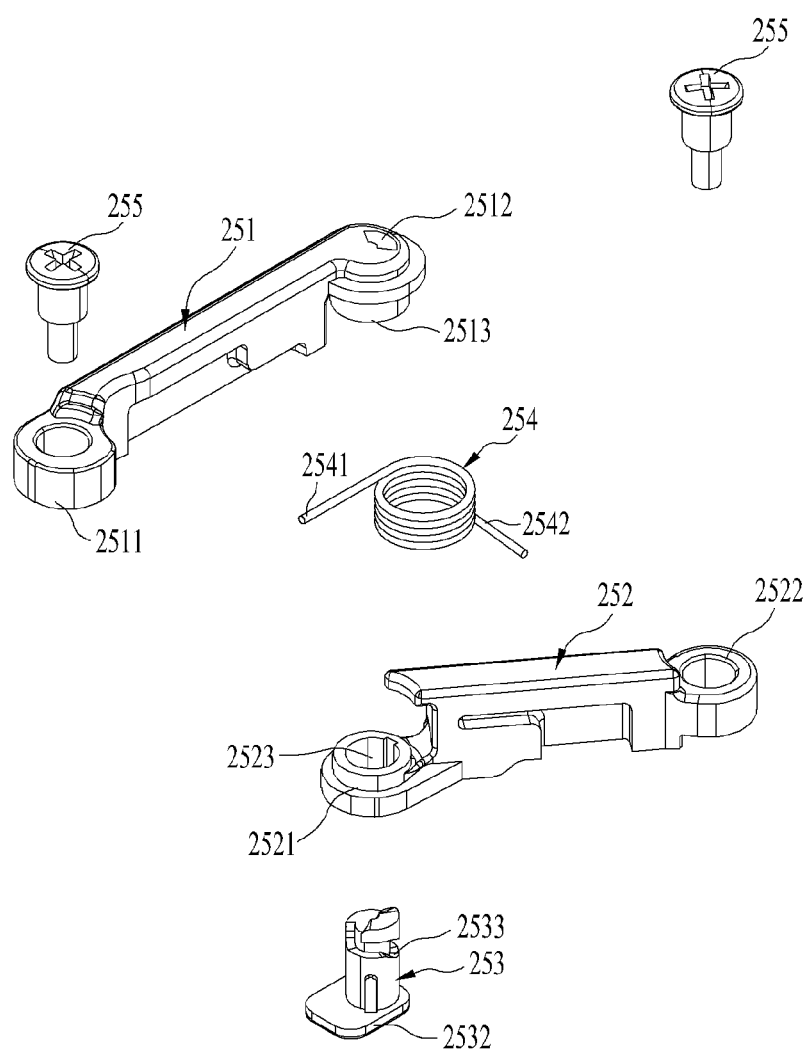
FIG. 13 is an exploded perspective view showing the link supporter of the mobile terminal.

FIG. 12 is a perspective view showing the link supporter 250 of the mobile terminal 100, and FIG. 13 is an exploded perspective view showing the link supporter 250 of the mobile terminal 100. FIG. 12(a) shows the link supporter 250 in the first state, and FIG. 12(b) shows the link supporter 250 in the second state.

The link supporter 250 includes a first link 251 and a second link 252. The angle between the first and second links 251 and 252 may change when the second frame 102 moves in the first direction. In the first state, that is, when the first and second frames 101 and 102 fully overlap with each other, the first and second links 251 and 252 overlaps with each other, that is, the first and second links 251 and 252 are folded and are arranged in parallel. In other words, the first and second links 251 and 252 are arranged such that the length direction thereof is in parallel to the third direction. In the second state, the angle between the first and second links 251 and 252 increases so that the first and second links 251 and 252 are stretched as shown in FIG. 11(b).

When the angle between the first and second links 251 and 252 is 180 degrees, the length direction of the first and second links 251 and 252 is in parallel to the second direction. In this case, if a user applies a force in the second direction, it may be difficult for the force to change the hinge angle between the first and second links 251 and 252 of the link supporter 250.

Thus, the first and second links 251 and 252 may be folded in the second state such that the angle between the first and second links 251 and 252 is less than 180 degrees as shown in FIG. 11(b) and FIG. 12(b). In the unfolded state, the link supporter 250 is located on the rear surface of the support bar 1041 and supports the center part of the display unit 151 to prevent it from falling down.

In the first state, the first and second links 251 and 252 are arranged in the same direction, and the angle between first and second links 251 and 252 may be 0 degree. The link supporter 250 may have a predetermined volume when the link supporter 250 is folded.

One end 2511 of the first link 251 is hinge-coupled to the end of the first frame 101 facing in the first direction, and the other end 2512 of the first link 251 is hinge-coupled to one end 2521 of the second link 252. The other end 2522 of the second link 252 is hinge-coupled to the end of the second frame 102 facing in the first direction. Each of the three pieces of hinge coupling may be rotated with respect to a rotation axis disposed in the thickness direction of the mobile terminal 100.

When the mobile terminal 100 transitions from the first state to the second state, the angle between the first and second links 251 and 252 may change, that is, the angle between the first link 251 and the first frame 101 and the angle between the second link 252 and the second frame 102 may also change. As shown in FIG. 12, a shaft screw 255 may be used to connect the first and second links 251 and 252 to the first and second frames 101 and 102, respectively so that rotation is allowed.

To prevent the third region 151c capable of moving to the front surface from falling down, the link supporter 250 needs to be disposed such that the link supporter 250 is in contact with the rear surface of the rolling hinge 104. However, if the width of the link supporter 250 in the thickness direction of the mobile terminal 100 is equivalent to the sizes of the rolling hinge 104 and the second rear portion 1022 of the second frame 102, there may occur friction when the shape of link supporter 250 changes. The friction may not only cause noise but prevent the mobile terminal 100 from transitioning between the first and second states.

Thus, the width of the link supporter 250 (in the thickness direction of the mobile terminal 100) needs to be smaller than the distance between the rolling hinge 104 and the second rear portion 1022. In addition, the width of the link supporter 250 needs to change in the vertical direction such that in the second state, the link supporter 250 is in contact with the rear surface of the rolling hinge 104 and capable of supporting the rolling hinge 104.

Thus, the link supporter 250 may be implemented such that the sizes of the first and second links 251 and 252 are variable in the thickness direction. However, one simple way is to use a hinge cam 253 for connecting the first and second links 251 and 252 with respect to a rotation axis.

The hinge cam 253 refers to a hinge axis capable of moving in the thickness direction of the mobile terminal 100 according to changes in the angle between the first and second links 251 and 252. The hinge cam 253 penetrates the other end 2512 of the first link 251 and the one end 2521 of the second link 252. Hinge holes 2513 and 2523 through which the hinge cam 253 penetrates are formed at the other end 2512 of the first link 251 and the one end 2521 of the second link 252. A bump may be formed inside each of the hinge holes 2513 and 2523.

Figure 14:
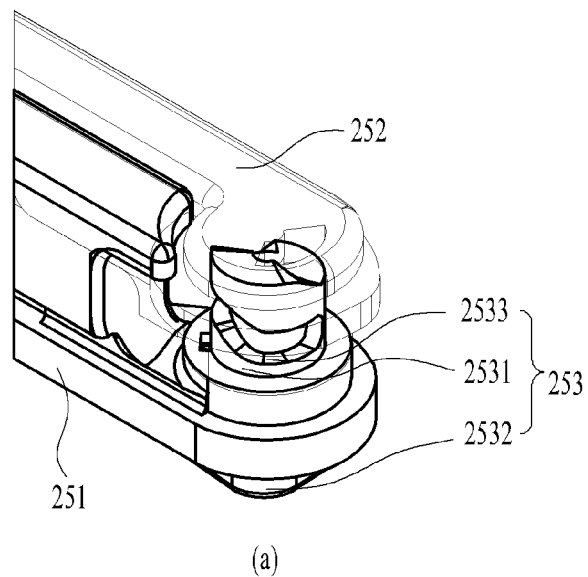
FIG. 14 is a view showing a change in the location of a hinge cam of the mobile terminal.
Figure 14:
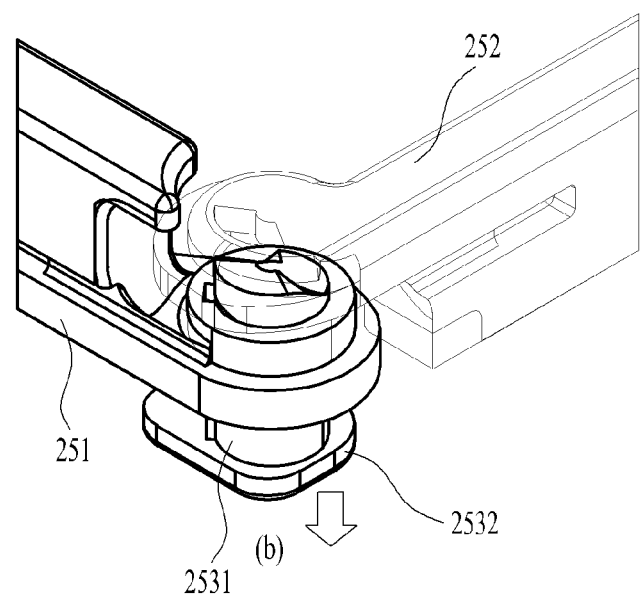

FIG. 14 is a view showing the location of the hinge cam 253 depending on the angle of the link supporter 250. FIG. 14(a) shows the arrangement of the hinge cam 253 in the first state, and FIG. 14(b) shows the arrangement of the hinge cam 253 in the second state. A spiral groove 2533 may be formed at one side of the hinge cam 253 or hinge holes 2513 and 2523, and a cam protrusion (not shown in the drawing) may be formed at the other side thereof. The cam protrusion may have a spiral shape matching with the shape of the spiral groove 2533. In this case, the shape of the cam protrusion may be similar to that of a screw. The cam protrusion may have a protrusion shape capable of moving in the spiral groove 2533 rather than the spiral shape.

Figure 15:
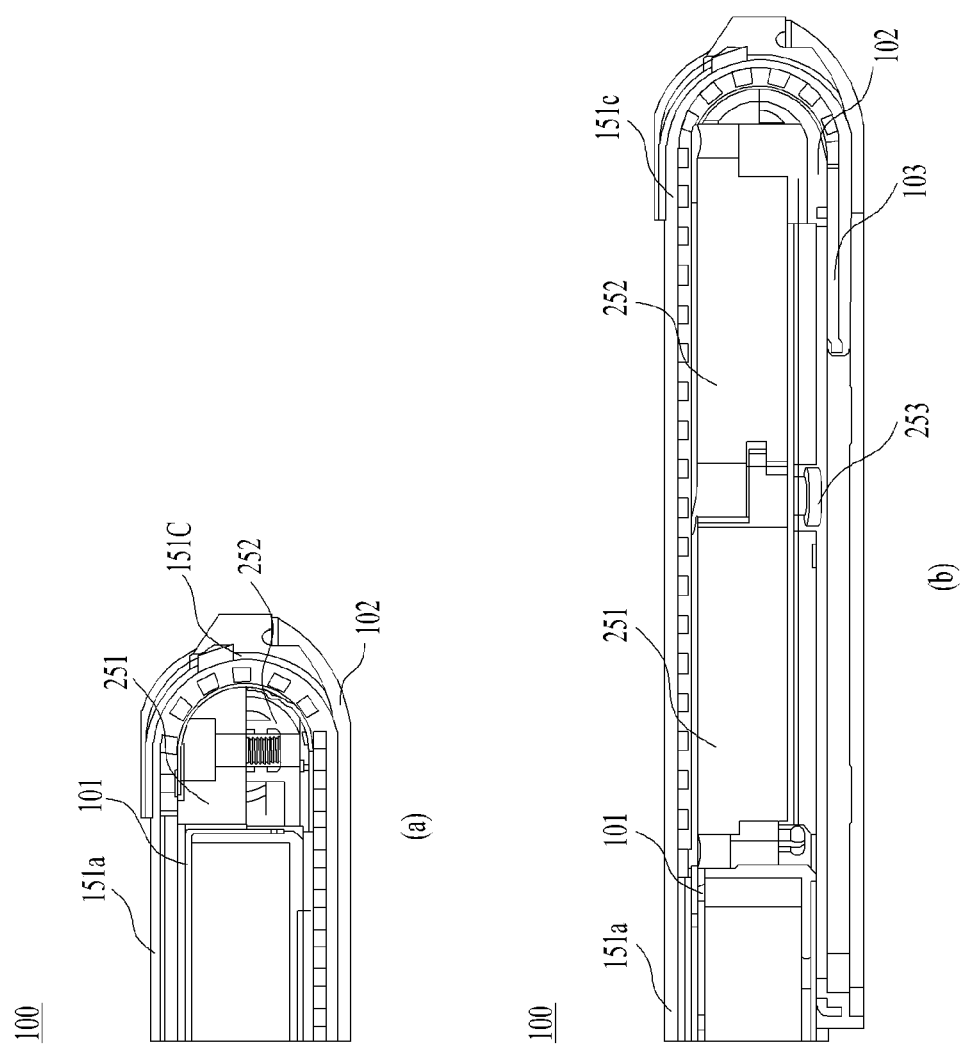
FIG. 15 is cross-sectional views taken along lines C-C and D-D.

FIG. 15 is cross-sectional views taken along lines C-C and D-D. FIG. 15(a) shows that the hinge cam 253 is located inside the hinge holes 2513 and 2523 of the first and second links 251 and 252 in the first state, and FIG. 15(b) shows that the hinge cam 253 protrudes to the rear surface and pushes the first and second links 251 and 252 toward the front surface of the mobile terminal 100 so as to support the third region 151c of the display unit 151.

When the first and second links 251 and 252 moves, the position of the cam protrusion in the spiral groove 2533 changes so that the hinge cam 253 moves in the thickness direction of the mobile terminal 100. The hinge cam 253 moves in the thickness direction and pushes the first and second links 251 and 252 to the front surface of the mobile terminal 100 to support the rear surface of the extended display unit 151.

When the hinge cam 253 protrudes to the rear surface of the mobile terminal 100, the first and second links 251 and 252 may be coupled such that the first and second links 251 and 252 are capable of moving in the thickness direction with respect to the first and second frame 101 and 102 in order for the link supporter 250 to move to the front surface. In other words, the link supporter 250 may be coupled to the first and second frames 101 and 102 such that the link supporter 250 is rotatable and movable in the thickness direction.

The hinge cam 253 coming into or out of the first and second links 251 and 252 may be provided to change the thickness of the link supporter 250. Since the link supporter 250 is not in contact with the second rear portion 1022 and the rolling hinge 104 before the second state, the friction between the link supporter 250 and the second frame 102, which occurs when the link supporter 250 is folded or stretched for the state transition of the mobile terminal 100, may be minimized. In the second state, the hinge cam 253 pushes the link supporter 250 in the front surface direction so that the first and second links 251 and 252 is in contact with the rear surface of the rolling hinge 104. By doing so, the hinge cam 253 supports the third region 151c that moves to the front surface.

To support the link supporter 250 stably in the second state, the hinge cam 253 may include a head 2532 extended in a portion where the hinge cam 253 is in contact with the second rear portion 1022. The other end 2512 of the first link 251 and the one end 2521 of the second link 252, which the hinge cam 253 is inserted into, overlap in the thickness direction. The sum of the thickness of the other end 2512 of the first link 251 and the thickness of the one end 2521 of the second link 252 may be equivalent to the thickness of other parts of the link supporter 250.

The state transition of the mobile terminal 100 may be performed by a force of the motor 201 of the driving unit 200. That is, the motor 201 provides the force that allows the second frame 102 to move in the first or second direction. The driving unit 200 may be disposed close to one side in the third direction in consideration of the arrangement of components such as a battery therein. In this case, since the force provided by the motor 201 changes depending on the distance from the motor 201, the angle between the first and second frames 101 and 102 may change, that is, the second frame 102 may be tilted.

To solve such a problem, a component for providing a force to the second frame 102 in the state transition of the mobile terminal 100 may be required in a place where the force of the driving unit 200 does not arrives. According to this embodiment, an elastic member 254 for providing a force when the angle between the first and second links 251 and 252 of the link support 250 changes may be provided.

The elastic member 254 may provide elasticity such that the angle between the first and second links 251 and 252 has a predetermined value. A torsion spring 254 including a spiral coil may be used as the elastic member 254.

In general, coil springs have elasticity in length directions thereof. However, in the case of the torsion spring 254, the number of wrapped coils changes depending on the angle between the ends of the torsion spring 254, and elasticity is provided as much as when the torsion coils 254 restores the changing number of wrapped coils to the original one. In other words, the torsion spring 254 is affected by the angle between members coupled to the ends of the coils.

The torsion spring 254 is arranged such that the torsion spring 254 surrounds the outer side of the hinge holes 2513 and 2523 formed at the one end 2511 of the first link 251 and the other end 2522 of the second link 252. One end of the torsion spring 254 is fixed to the first link 251, and the other end thereof is fixed to the second link 252. The torsion spring 254 may provide a force that allows the first and second links 251 and 252 to maintain the angle therebetween in the first state or a force that allows the first and second links 251 and 252 to maintain the angle therebetween in the second state.

In the former case, elasticity needs to be provided when the second frame 102 moves in the second direction, and an additional force opposite to the elasticity needs to be provided when the second frame 102 moves in the first direction. In the latter case, elasticity needs to be provided to the second frame 102 when the second frame 102 moves in the first direction, and the driving unit 200 needs to provide an additional force opposite to the elasticity when the mobile terminal 100 transitions to the first state.

Figure 16:
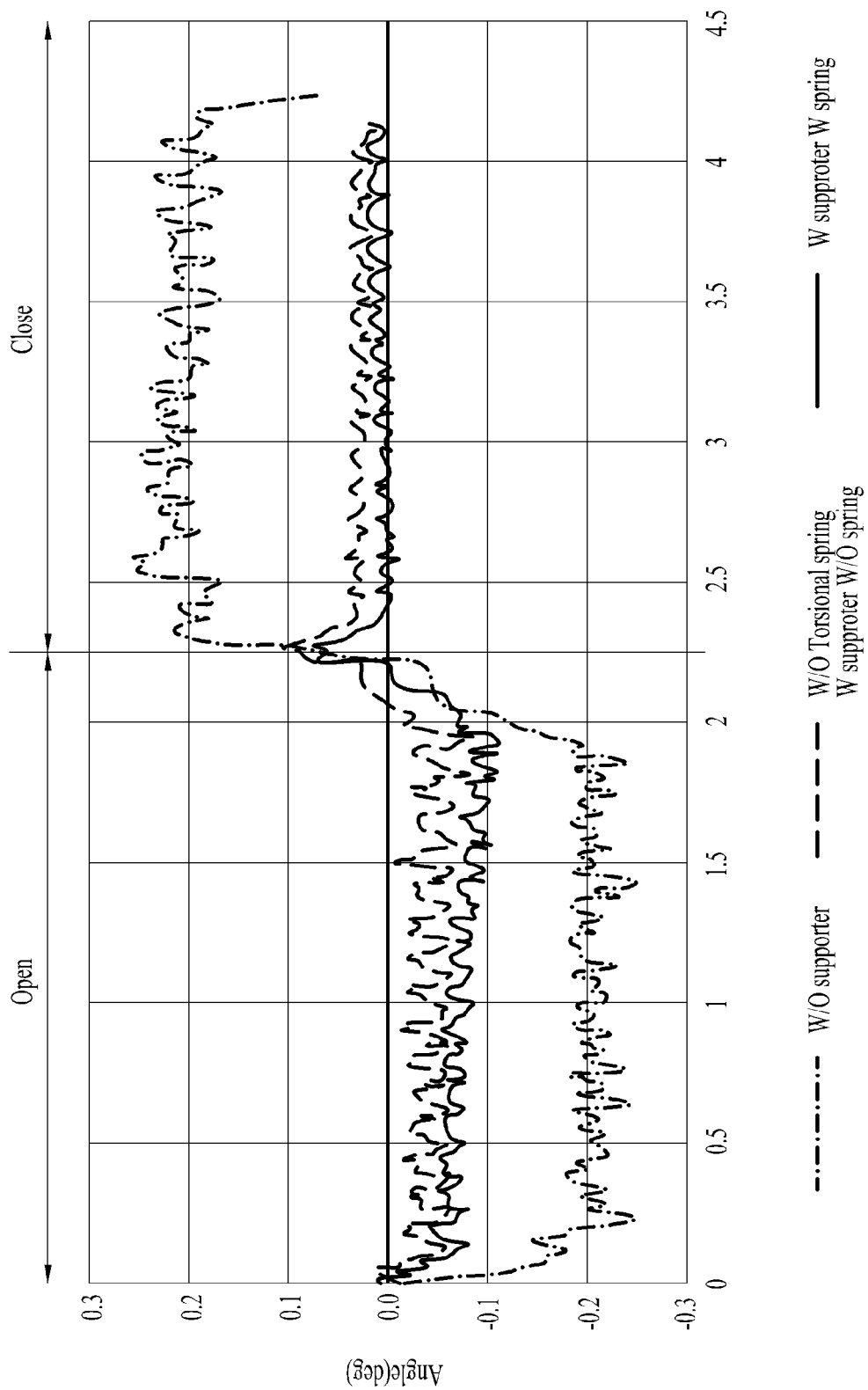
FIG. 16 is a graph showing the degree of tilting in the state transition of the mobile terminal in the following cases: when the link supporter is not present; when the link supporter is present; and when the link supporter is present together with an elastic member.

FIG. 16 is a graph showing the degree of tilting in the state transition of the mobile terminal 100 in the following cases: when the link supporter 250 is not present; when the link supporter 250 is present; and when the link supporter 250 and the elastic member 254 are present.

The left part shows the degree of tilting when the mobile terminal 100 transitions to the second state, that is, when the second frame 102 moves in the first direction, and the right part shows the degree of tilting when the mobile terminal 100 transitions to the first state, that is, when the second frame 102 moves in the second direction.

The degree of tilting refers to the inclination of the second frame 102 which depends on a position difference between the top and bottom parts of the second frame 102. It may be seen that the degree of tilting increases during the state transition of the mobile terminal 100 as the position difference between the top and bottom parts increases. In the graph, "open" means that the mobile terminal 100 transitions to the second state, that is, the second frame 102 moves in the first direction, and "close" means that the mobile terminal 100 transitions to the first state, that is, the second frame 102 moves in the second direction.

When the link supporter 250 is not present, that is, when only the driving unit 200 is in charge of moving the second frame 102, the degree of tilting increases since the driving unit 200 is disposed close to the one side in the third direction.

When the link supporter 250 is present, the degree of tilting is reduced by about 10% compared to when the link supporter 250 is not present. Thus, the second frame 102 may stably move. When the mobile terminal 100 is open, the link supporter 250 without the elastic member 254 minimizes the degree of tilting, that is, the link supporter 250 without the elastic member 254 opens the mobile terminal 100 stably. When the mobile terminal 100 is closed, the link supporter 250 with the elastic member 254 minimizes the degree of tilting, that is, the link supporter 250 with the elastic member 254 closes the mobile terminal 100 stably.

Figure 17:
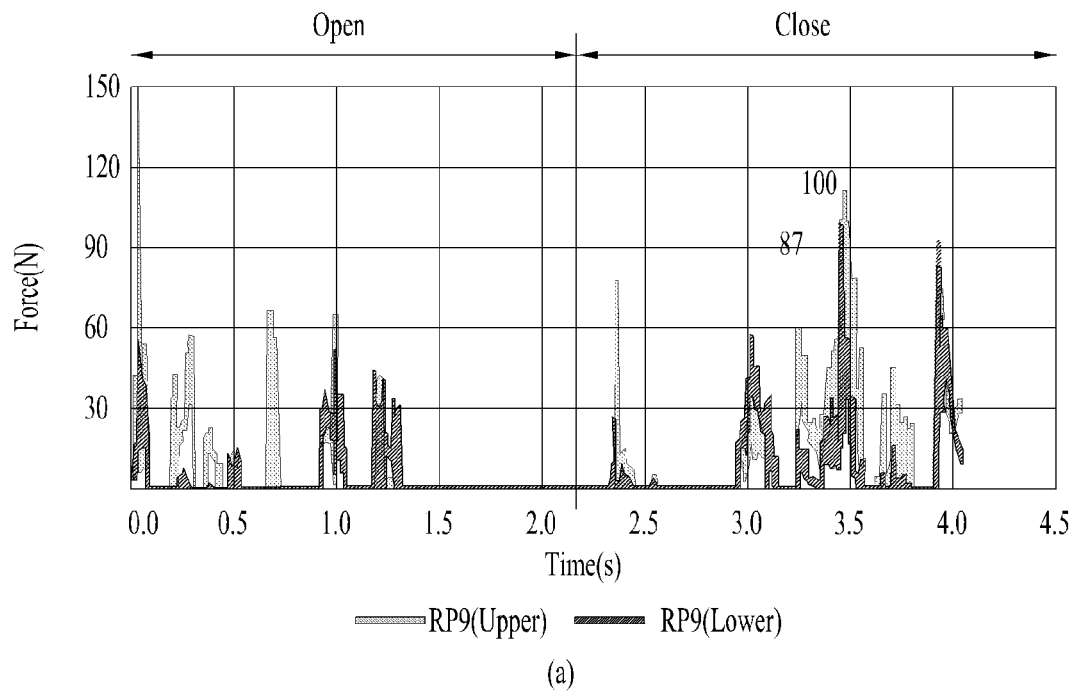
FIG. 17 is a graph showing the repulsive force of the rolling hinge and the frictional force of a linear guide when the mobile terminal transitions between the states without the link supporter.
Figure 17:
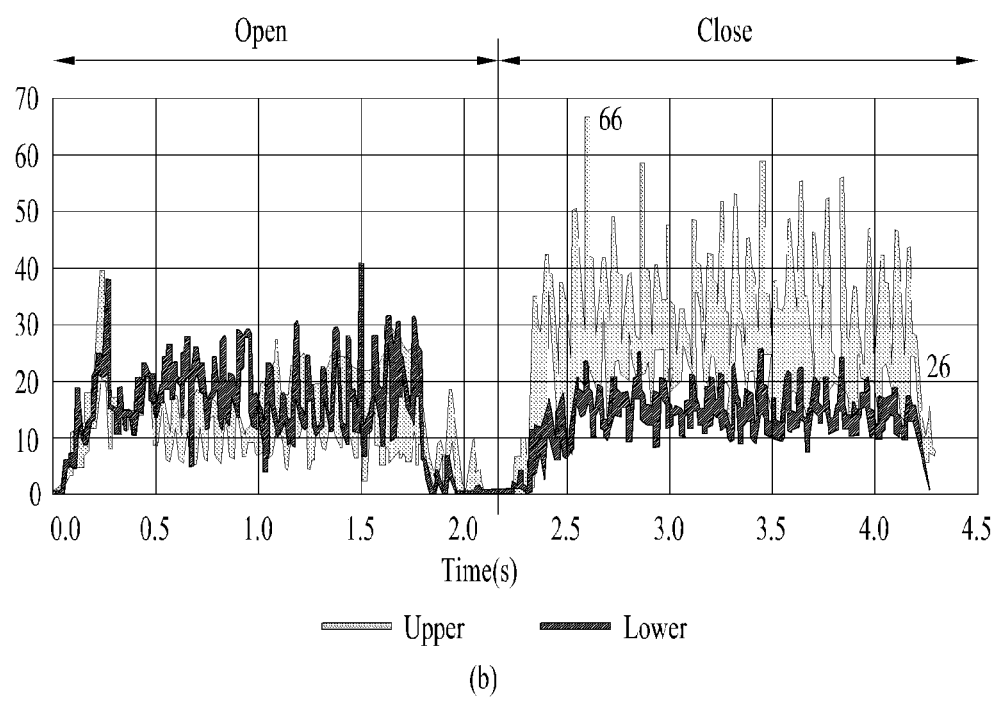
Figure 18:
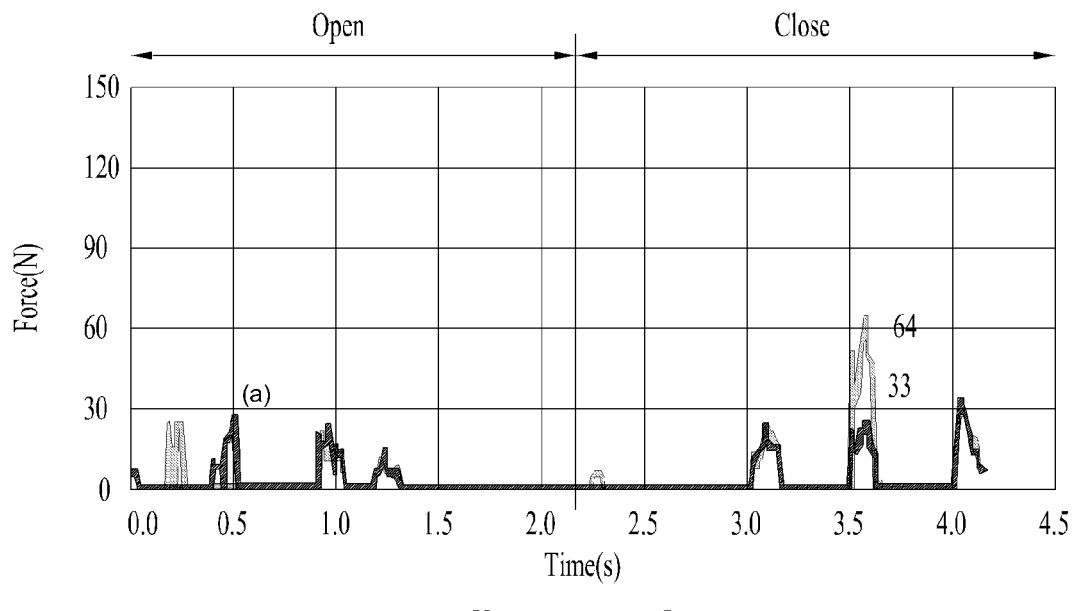
FIG. 18 is a graph showing the repulsive force of the rolling hinge and the frictional force of the linear guide when the mobile terminal transitions between the states with the link supporter.
Figure 18:
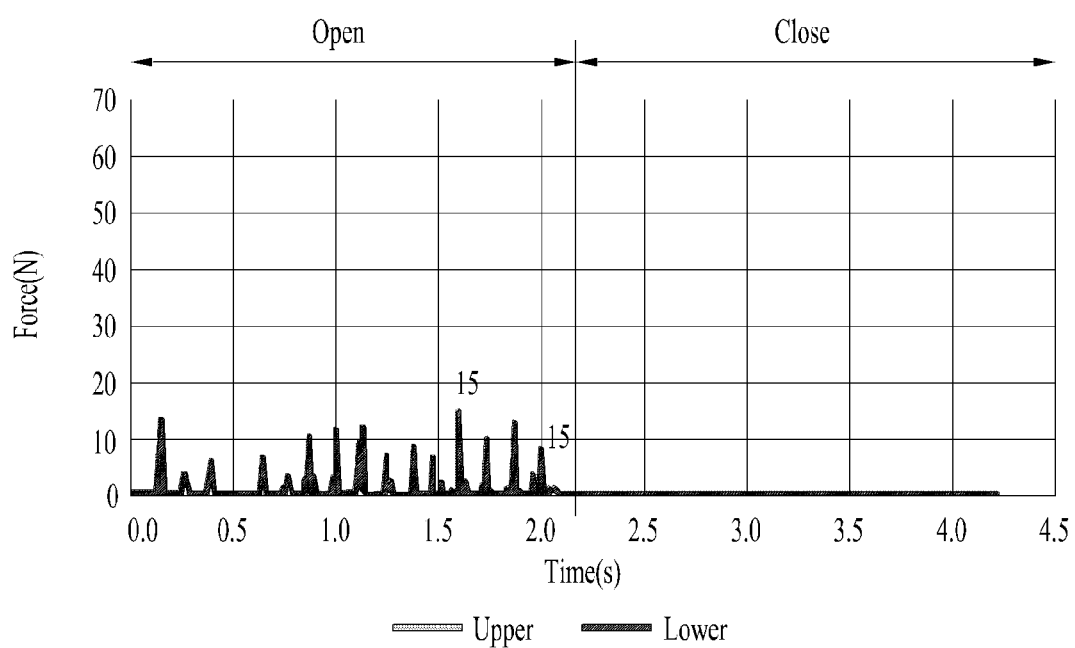
Figure 19:
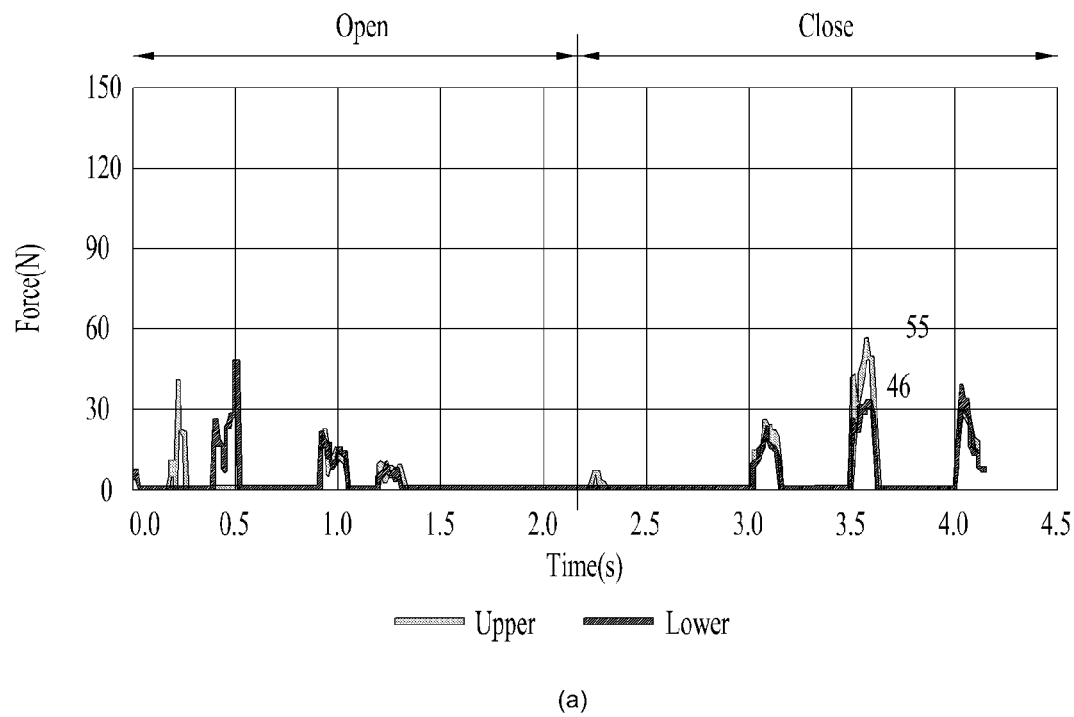
FIG. 19 is a graph showing the repulsive force of the rolling hinge and the frictional force of the linear guide when the mobile terminal transitions between the states with the link supporter including a spring.
Figure 19:
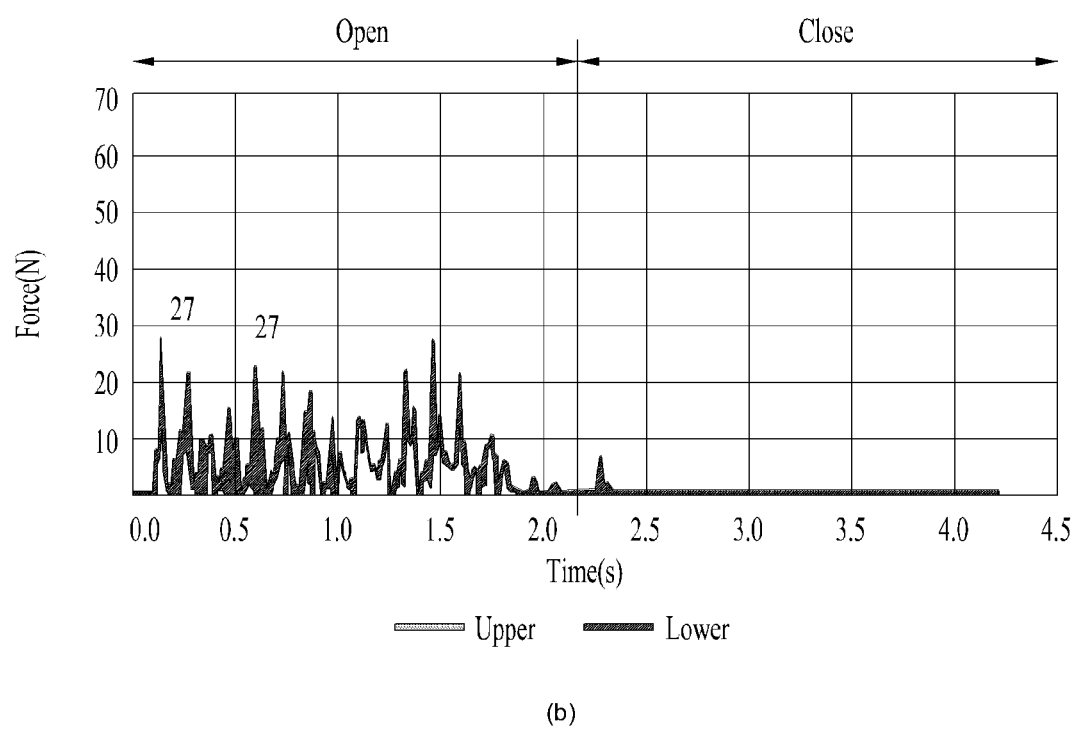

FIG. 17 is a graph showing the repulsive force of the rolling hinge 104 and the frictional force of the linear guide 230 when the mobile terminal 100 transitions between the states without the link supporter 250. FIG. 18 is a graph showing the repulsive force of the rolling hinge 104 and the frictional force of the linear guide 230 when the mobile terminal 100 transitions between the states with the link supporter 250. FIG. 19 is a graph showing the repulsive force of the rolling hinge 104 and the frictional force of the linear guide 230 when the mobile terminal 100 transitions between the states with the link supporter 250 including the spring.

FIGS. 17(a), 18(a), and 19(a) show the repulsive force of the rolling hinge 104, and FIGS. 17(b), 18(b), and 19(b) show the reaction force of the linear guide 230 measured at the top and bottom of the mobile terminal 100. The reaction force refers to a force acting in the direction opposite to the progress direction. In this case, as the reaction force increases, the force required for the movement of the second frame 102 increases. In addition, the reaction force is measured at the top and bottom of the mobile terminal 100. As the reaction force difference between the top and bottom increases, the degree of tilting may increase.

As shown in FIG. 17, when the link supporter 250 is not present, both the repulsive force of the rolling hinge 104 and the repulsive force of the linear guide 230 increase. In particular, when the mobile terminal 100 is closed, the repulsive forces increase. When the mobile terminal 100 is closed, the driving force of the motor 201 is not completely delivered to the rolling hinge 104, and thus there may be a mismatch between the rolling hinge 104 and the second frame 102.

The linear guide 230 is disposed between the first and second frames 101 and 102. When the reaction force of the linear guide 230 increases, it may disturb the sliding movement between the first and second frames 101 and 102.

When the link supporter 250 is provided as shown in FIGS. 18(a) and 19(A), the repulsive force of the rolling hinge 104 significantly decreases while the mobile terminal 100 is open and closed. When the link supporter 250 is provided as shown in FIGS. 18(*b*) and 19(*b*), the repulsive force of the linear guide 230 significantly decreases. In particular, it can be seen that the repulsive force difference between the top and bottom significantly decreases.

The reason for this is that the degree of tilting decreases when the link supporter 250 is provided as shown in FIG. 16. Further, when the link supporter 250 is provided, the reaction force of the linear guide 230 may significantly decrease when the mobile terminal 100 is closed.

The presence or absence of the elastic member 254 may slightly affect the degree of tilting. When the elastic member 254 is present, it may reduce the reaction force of the rolling hinge 104. However, when the elastic member 254 is not present, it may reduce the reaction force of the linear guide 230 when the mobile terminal 100 is open.

As described above, the mobile terminal 100 according to the present disclosure may adjust the size of a screen according to the need, thereby satisfying both portability and utility. The mobile terminal 100 may prevent the display unit 151 from being damaged since stress is not concentrated at a specific point of the display unit 151.

The mobile terminal 100 may prevent the screen from being wavy, that is, keep the flatness of the screen independently of the state transition of the mobile terminal 100.

The thickness of the link supporter 250 changes according to the state transition of the mobile terminal 100, thereby minimizing the effect of the state transition on the sliding movement and stably supporting the extended screen of the display unit 151 in the second state.

The link supporter 250 may support the sliding movement of the mobile terminal 100, thereby reducing the degree of tilting.

The above-described embodiments are to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

What is claimed is:

1. A mobile terminal comprising:
    a body comprising:
        a first frame; and
        a second frame configured to slide with respect to the first frame in a first direction to transition the body from a first state to a second state or in a second direction opposite to the first direction to transition the body from the second state to the first state;
    a flexible display configured to cover a part of the body, wherein a front surface of the flexible display varies according to the sliding of the second frame; and
    a link supporter disposed between the first and second frames, wherein the link supporter comprises:
    a first link, wherein a first end of the first link is hinge-coupled to the first frame;
    a second link, wherein a first end of the second link is hinge-coupled to the first link and a second end of the second link is coupled to the second frame; and
    a hinge cam configured to be inserted into a second end of the first link and the first end of the second link, wherein a location of the hinge cam varies depending on an angle between the first and second links, wherein the link supporter is configured to fold the first link and the second link together in the first state and spread the first link and the second link apart in the second state.

2. The mobile terminal of claim 1, wherein the hinge cam is further configured to extend with respect to a space between a rear surface of the flexible display and the second frame in the second state.

3. The mobile terminal of claim 2, wherein the hinge cam is further configured to be inserted into the first and second links in the first state, and wherein the hinge cam is configured to protrude from the first and second links in the second state.

4. The mobile terminal of claim 3, comprising:
    a hinge hole formed in the second end of the first link and the first end of the second link; and
    a cam protrusion formed inside the hinge hole; and
    a spiral groove formed on an outer surface of the hinge cam, wherein the cam protrusion is configured to be inserted into the spiral groove.

5. The mobile terminal of claim 3, wherein a head of the hinge cam is in contact with the second frame in the second state.

6. The mobile terminal of claim 1, wherein the link supporter is located in a third direction perpendicular to the first direction in the first state, and wherein the angle between the first and second links is less than or equal to 180 degrees in the second state.

7. The mobile terminal of claim 1, further comprising an elastic member disposed between the second end of the first link and the first end of the second link.

8. The mobile terminal of claim 7, wherein the elastic member comprises a torsion spring surrounding the hinge cam, and wherein a first end of the elastic member is coupled to the first link and a second end of the elastic member is coupled to the second link.

9. The mobile terminal of claim 1, comprising:
    a side portion disposed at an end of the second frame, wherein the side portion faces in the first direction; and
    a link storage space formed inside the side portion, wherein the link supporter is folded and stored in the link storage space in the first state.

10. The mobile terminal of claim 1, wherein the link supporter is one of a plurality of link supporters each arranged in a third direction perpendicular to the first direction.

\* \* \* \* \*